(12) United States Patent
Lee et al.

(10) Patent No.: US 7,061,042 B2
(45) Date of Patent: Jun. 13, 2006

(54) DOUBLE-CELL MEMORY DEVICE

(75) Inventors: Chien-Hsing Lee, Jhubei (TW); Chin-Hsi Lin, Hsinchu (TW); Jhyy-Cheng Liou, Jhubei (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 10/871,170

(22) Filed: Jun. 18, 2004

(65) Prior Publication Data

US 2005/0167731 A1 Aug. 4, 2005

Related U.S. Application Data

(60) Provisional application No. 60/541,611, filed on Feb. 3, 2004.

(51) Int. Cl.
*H01L 29/788* (2006.01)

(52) U.S. Cl. .................. 257/315; 257/317; 365/185
(58) Field of Classification Search ............... 257/317; 365/185
See application file for complete search history.

(56) References Cited

U.S. PATENT DOCUMENTS 6,563,736 B1 * 5/2003 Hsu et al. ............ 365/185.18
2004/0057286 A1 3/2004 Chiou-Feng Chen et al. .... 365/185.17

* cited by examiner

*Primary Examiner*—Mai-Huong Tran
(74) *Attorney, Agent, or Firm*—J.C. Patents

(57) ABSTRACT

A memory array device has a plurality of gate structure lines, adjacently disposed over a substrate along a direction, wherein at least a portion of the gate structure lines have memory function. A plurality of first doped regions, in the substrate at a side of a first line of the gate structure lines. A plurality of second doped regions, in the substrate at a side of a last line of the gate structure lines. Wherein the first doped regions and the second doped regions respectively for a plurality of pairs of doped region with respect to a plurality of bit lines. In other words, the conventional source/drain regions for each memory cell are saved. Instead, the gate lines are adjacently disposed together.

25 Claims, 26 Drawing Sheets

DOUBLE-CELL MEMORY DEVICE

CROSS-REFERENCE TO RELATED APPLICATION

This application claims the priority benefits of U.S. provisional application titled" "DOUBLE-CELL MEMORY DEVICE" filed on Feb. 3, 2004, Ser. No. 60/541,611. All disclosure of this application is incorporated herein by reference.

BACKGROUND OF THE INVENTION

1. Field of Invention

The present invention relates to flash memory. More particularly, the present invention relates to a double-cell flash memory.

2. Description of Related Art

Non-volatile memory device, such as flash memory device, allows multiple times erase and program operation inside system. As a result, flash memory is suitable to many of advance hand-held digital equipments, including solid state disks, cellar phones, digital cameras, digital movie cameras, digital voice recorders, and PDA, that are demanding a low-cost, high-density, low-power-consumption, highly reliable file memory.

Conventionally, flash memory is characterized into two cell structures, in which one is double poly NAND type memory cell with Poly1 as a floating gate to store charges, and the other one is the single poly SONOS cell with SiN as storage node, wherein ONO represent the dielectric stack layer of oxide/nitride/oxide (O/N/O). FIGS. 1A–1B are cross-sectional views, schematically illustrating conventional stack gate NAND flash memory cell. In FIG. 1A, the conventional NAND flash includes numerous strings of series connected N-channel transistor. For one memory cell, it has the control gate 110 and the floating gate 112 stacked together. The control gates are respectively connected to the word lines WL0, WL1, . . . The selection transistor 106 and 108 are used to select a memory block. One source/drain (S/D) region of the selection transistor 106 is coupled to the corresponding bit line, while the S/D region of the selection transistor 108 is coupled to a voltage source Vss, which usually is a ground voltage. The memory cells are formed in a triple-well 104. Since the memory device a CMOS device with logic part, the triple-well 104 is also within a deep N-well 102, which is formed in the P-type substrate 100.

FIG. 1B is the cross-sectional structure along the word line direction with respect to FIG. 1A. The shallow trench isolation (STI) 116 structures are between cells. However, due to the necessary of alignment, the floating gate 112 has an overlap region 118 with the STI 116. The cause additional cell size by for example about 0.5 F. Here, F known by the ordinal skilled artisans represents the minimum size, such as critical dimension. The cell size for the conventional cell structure is 2.5 F×2.0 F.

The operation of NAND Flash utilizes channel FN programming and erase as shown in FIGS. 2A–2B. The threshold Vth is used to store the binary data. In FIG. 2A, the programming process is to bring a negative threshold value to the positive threshold value. The reverse direction is for the erase operation.

In FIG. 2B, according to the FN tunneling mechanism, when cell content is erased, the world line is applied a ground voltage while the TPW is applied with a positive voltage. As a result, electrons in the floating gate 120 are ejected to the substrate. When the programming operation is performed, the S/D region is applied a ground voltage while the world line is applied a positive voltage Vpp. As a result, the electrons are injected into the floating gate by tunneling effect. The operation is known by the skilled artisans, and is not further described.

For another design of SONOS type flash memory, the device operation of SONOS cell is adopted channel hot carrier programming and band-to-band (B—B) hot hole erase. Cell size of SONOS cell is around 4 $F^2$. However the reliability of SONOS cell is very sensitivity to hot electron and hot hole stress during program and erase operation. FIG. 3A is a drawing, schematically illustrating the content distribution of the memory cells with O/N/O dielectric layer design. FIG. 3B is a drawing, schematically illustrating the operation mechanism for the memory cell with O/N/O dielectric layer design. In FIG. 3B, the gate dielectric layer is an ONO structure layer 122, in which the nitride layer serves as the storage layer.

For the programming operation, the one S/D region 126 is grounded, and the other S/D region is coupled to the bit line (BL) with a voltage $V_D$, and the word line 124 is applied with a higher voltage. The hot electrons are tunneled into the nitride layer. When the erase operation is performed, the word line is applied with a negative voltage and bit line is applied with positive voltage. As a result, the B—B hot holes are injected into the nitride layer to annihilate with the trapped electrons. The operation mechanism is also known by the skilled artisans and is not further described.

Based on the programming and erase mechanism, the conventional stack gate NAND flash memory is designed as shown in FIG. 4A and FIG. 4B. FIG. 1A also shows the cross-sectional structure. In FIG. 4A, the gates SGD and SGS are two selection gates to select the memory block. One S/D regions 130 (dotted) beside the gate SGD is coupled to the bit line BL0, BL1, . . . BLn by the plug structures 132. One S/D region 130 beside the selection gate SGS is coupled to the source line 134 through the plug structures 136. There also are doped source region 130 in the substrate beside the world lines WL0, WL1, . . . WLn, which are also the gates of the transistors for the memory cells. The equivalent circuit structure is shown in FIG. 4B.

It should be noted that, the cell size is in the conventional cell array is 2 F×2.5 F=5 $F^2$. The operation for the NAND string cell have eight NMOS Flash cell in series is for example shown in Table 1. The disadvantage of prior art for the stack gate NAND Flash at least that the cell size of prior invention is closely to 5 $F^2$ that is limited by Floating Gate overlap Active. The SONOS Flash has the disadvantages at least that cell reliability is strongly affected by hot electron and hole stress during program and erase operation respectively.

TABLE 1

Device operation of conventional NAND Flash memory cell.

| NODE | ERASE | Program (selected) | Program (non-selected) | Read |
|---|---|---|---|---|
| BL | FG | GND | VCC | 1 V |
| SGD | FG | VCC | VCC | VCC |
| WL0 | GND | 1/2VPP | 1/2VPP | VCC |
| WL1 | GND | 1/2VPP | 1/2VPP | VCC |
| WL2 | GND | 1/2VPP | 1/2VPP | VCC |
| WL3 | GND | 1/2VPP | 1/2VPP | VCC |
| WL4 | GND | 1/2VPP | 1/2VPP | VCC |
| WL5 (selected WL) | GND | VPP | VPP | GND |

TABLE 1-continued

Device operation of conventional NAND Flash memory cell.

| NODE | ERASE | Program (selected) | Program (non-selected) | Read |
|---|---|---|---|---|
| WL6 | GND | 1/2VPP | 1/2VPP | VCC |
| WL7 | GND | 1/2VPP | 1/2VPP | VCC |
| SGS | FG | GND | GND | VCC |
| VS | FG | GND | GND | GND |
| P-WELL | VPP | GND | GND | GND |

SUMMARY OF THE INVENTION

The invention provides a double-cell memory device, which save the source/drain regions of a conventional memory cell. Instead, additional gates are formed on the substrate corresponding to the locations of the conventional source/drain regions. When one gate is selected, the other gates are applied a pass voltage to allow the two source/drain regions to extend to the side of the selected gate.

The invention provides a cell string structure of double-cell memory device with respect to a bit line. The cell string structure comprises a first doped region and a second doped region in a substrate, and a plurality of gate structures in a string, formed on the substrate between the first doped region and the second doped region. Wherein, at least a portion of the gate structures serves as a memory cell. the gate structures is separately coupled to a word line. In this structure, for example, when the first doped region and the second doped region are respectively applied a first voltage and a second voltage, and a selected gate of the gate structures is applied with a third voltage, then the other gate structures are applied a pass voltage, so that the first doped region and the second doped region in the substrate extend to each side of the selected gate.

In another aspect, the present invention further comprises a first selection MOS transistor and a second selection MOS transistor. The first selection MOS transistor has a first source/drain region coupled to the bit line and a second source/drain region serving as the first doped region. The second selection MOS transistor has a first source/drain region coupled to a system voltage source Vss and a second source/drain region serving as the second doped region.

The invention also provides a layout of a double-cell memory device. The layout comprises a plurality of gate structure lines, adjacently disposed over a substrate along a direction, wherein at least a portion of the gate structure lines have memory function. A plurality of first doped regions is in the substrate at a side of a first line of the gate structure lines. A plurality of second doped regions is in the substrate at a side of a last line of the gate structure lines, wherein the first doped regions and the second doped regions respectively for a plurality of pairs of doped region with respect to a plurality of bit lines.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The invention provides a nonvolatile memory device, such as flash memory. The flash memory can further, for example, be a double-cell memory device, which save the source/drain regions of a conventional memory cell. Instead, additional gates are formed on the substrate corresponding to the locations of the conventional source/drain regions. When one gate is selected, the other gates are applied a pass voltage to allow the two source/drain regions to extend to the side of the selected gate.

In other words, a double poly electrically programmable SONOS Flash memory with NAND cell structure is disclosed as an example. The memory device includes many of NAND cells blocks. Every NAND cell blocks include two groups of NAND SONOS memory cells in series that are named as SONOS-P1 and SONOS-P2. Each of NAND cells block has a Drain selection transistor (SDG) for the corresponding BL, a series array of SONOS-P1/SONOS-P2, and a Source selection transistor to the corresponding Source line. Each SONOS cell consisted of a control gate and ONO film structure, where the SIN acts as storage node to store electron or hole for cell of "0" and "1" state respectively. SONOS-P2 cells will act as Pass Gate transistor during Program/Read operation of SONOS-P1. On the other hand SONOS-P1 cells serves as the pass-gate transistor for operation of SONOS-P2. Erase operation is performed by whole array F-N erase.

Above, from the practical operation point of view, the cell SONOS-P1 and the cell SONOS-P2 are used to distinguish the poly1 gate from the poly2 gate. The poly2 gate is located above the position for the conventional S/D regions. In the invention the S/D doped regions are saved. Actually, it is not necessary to group the cells into SONOS-P1 and the cell SONOS-P2 (see FIG. 5), as to be described in better details. For example, if there are 64 gates, then it can be adapted into 64 word lines, or adapted into 32 word lines with one word line having double cells. The later arrangement with double-cell is taken as the example for descriptions but not for the limitation.

Figure 1A:
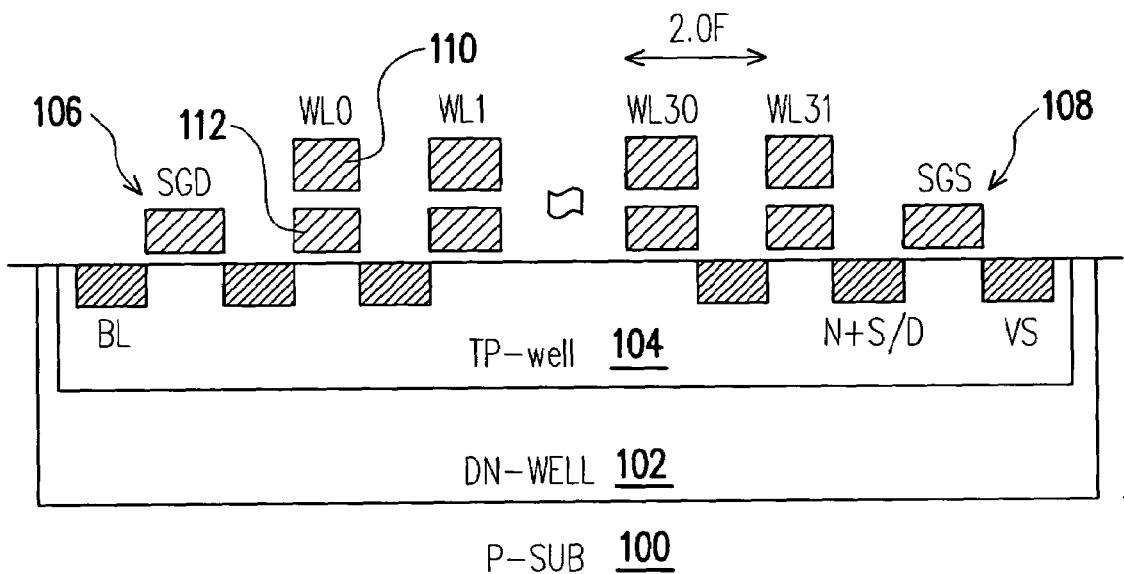
FIGS. 1A–1B are cross-sectional views, schematically illustrating a conventional semiconductor structure of a NAND flash memory.
Figure 5:
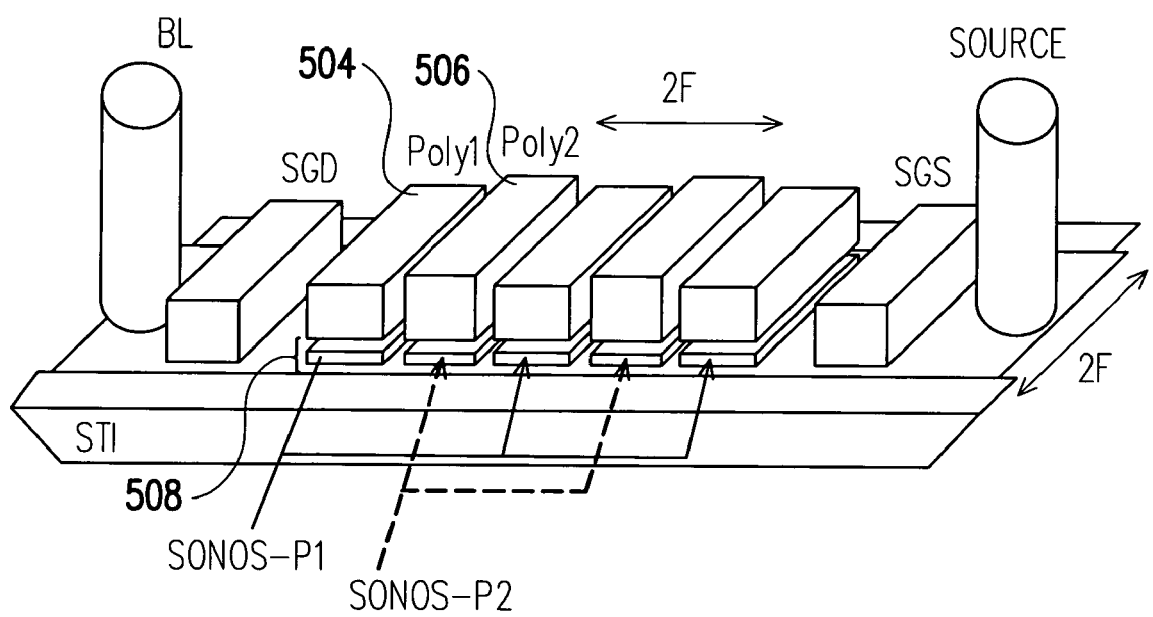
FIG. 5 is a perspective view, schematically illustrating a structure of the memory device, according to an embodiment of the invention.

In order to at least get smaller cell size and perform good reliability, a new compact NAND-type Flash Memory cell, such as double-cell structure, is proposed in the invention. FIG. 5 is a perspective view, schematically illustrating a structure of the memory device, according to an embodiment of the invention. In FIG. 5, the newly proposed double NAND Cell structure is adopted in the NAND Type array architecture. Each of NAND cells block, for example, include 2 groups of SONOS cells in series. One group (SONOS-P1) is corresponding to the usual polysilicon gate poly1 504. Another group (SONOS-P2) is corresponding to the gates poly2 506 above the conventional S/D doped regions. The S/D doped regions between the word lines or the gates 504 and 506 are saved in the invention. In other words, one cell has a double-cell structure. However, the arrangement of double-cell is for practical operation for multiple programming flash memory. In general, it is not necessary to distinguish the gates of poly1 and poly2. The gates poly1 504 and poly2 506 can be used by a sequential word lines. In FIG. 5, the cell structure has the ONO dielectric layer 508 as the example. The cell size is (2 F×2 F)/2=2 $F^2$. Here, since the S/D region is bot pre-formed in the substrate, 0.5 F for the alignment (see FIG. 1A) is further saved.

Figure 6A:
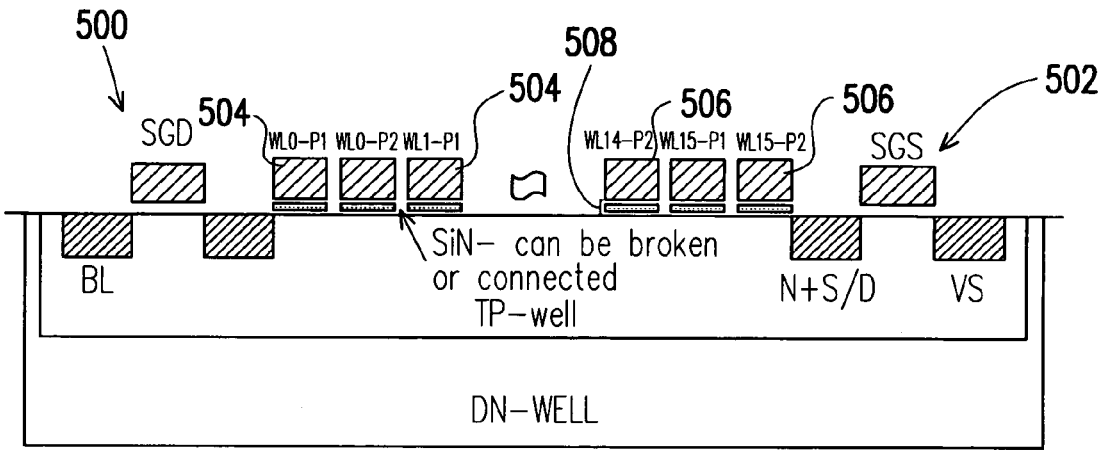
FIGS. 6A–6C are cross-sectional views in two directions, schematically illustrating the semiconductor structure for the memory device, according to an embodiment of the invention.
Figure 6B:
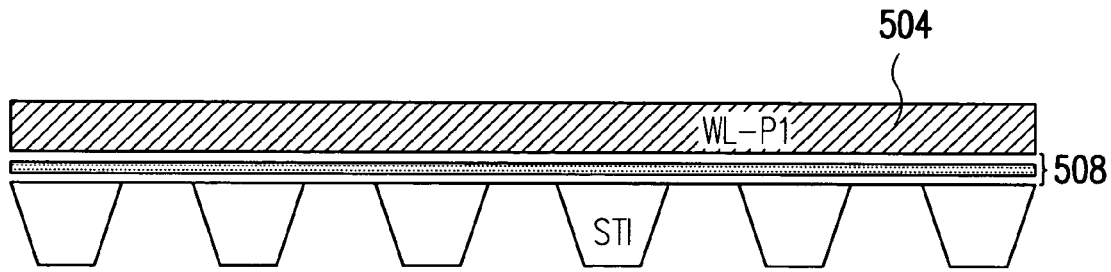
Figure 6C:
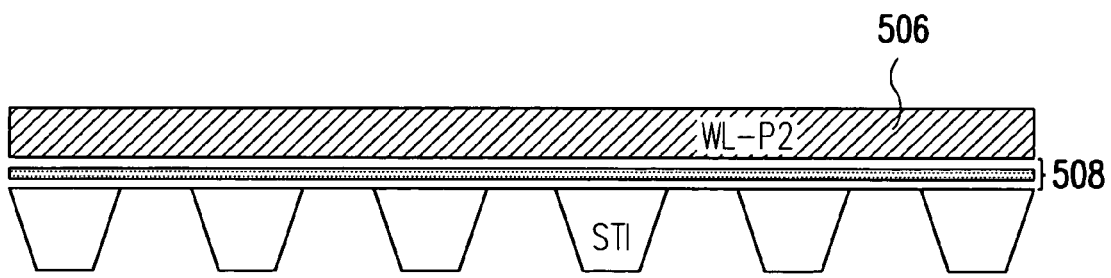

FIGS. 6A–6C are cross-sectional views in two directions, schematically illustrating the semiconductor structure for the memory device, according to an embodiment of the invention. In FIG. 6A, a cross-sectional semiconductor structure along the bit line direction is shown. The selection transistor 500 with the selection gate SGD and the selection transistor 502 with the selection gate SGS are located on both sides. Several gates corresponding to the word lines WL0-P1, WL0-P2, WL1-P1, WL1-P2, . . . , are located between the selection transistors 500, 502. The selection transistors are used to select the memory block, which is to be described in FIG. 11B. The memory cell are, for example, N-type MOS devices formed on a P-type well (triple P-well, TP-well). The S/D region is the N+ doped region. One S/D region serving as the drain region is coupled to the bit line BL, while the S/D region beside the selection gate SGS, serving as the source region, is coupled to the source line with the voltage VS.

In the invention, the operation mechanism is described as follows. The selection transistors 500, 502 are to provide the source region and the drain region. However, in the invention, the doped S/D region between the word lines are saved. As the foregoing description, the world lines with P2 are corresponding to the conventional S/D regions. Once one cell with respect to one word line, such as WL0-P2, is selected, the other gates are applied with a pass voltage to allow the S/D region to extend to each side of the gate WL0-P2. Here, the pass voltage has the similar function of the turn-on voltage on the gate for the usual MOS transistor, so as to create the channel region under the gate. In this manner, the channel region and the S/D region are joined together as a large junction region. In other words, the other gates serve as the passing gates for passing the S/D regions. In FIG. 6A, the memory cell is a SONOS cell as the example with the ONO dielectric layer 508 for storing the binary data. FIG. 6B and FIG. 6C are the cross-sectional views along the word lines for WL-P1 and WL-P2.

Figure 7:
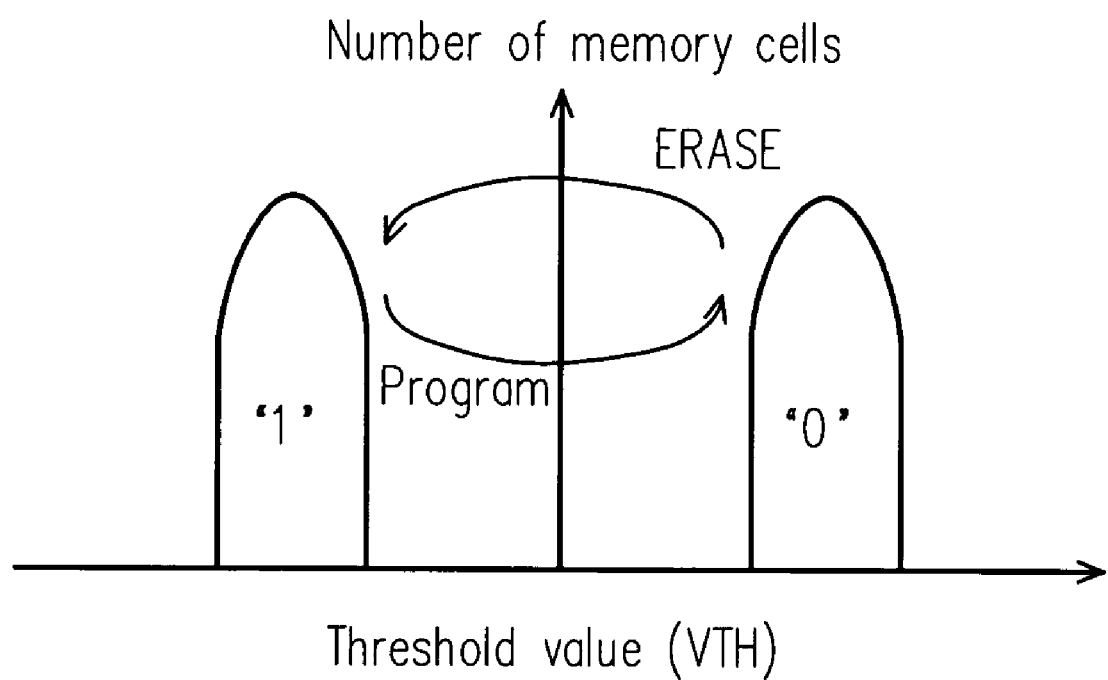
FIG. 7 is a drawing, schematically illustrating a content distribution for the memory device, according to an embodiment of the invention.

For this kind of memory cell, the binary data is stored by the threshold voltage $V_{TH}$ as shown in FIG. 7. For example, the lower threshold value, such as the negative threshold value, represents the binary 1. The higher threshold value represent the binary data "0". However, the actual definition for "1" and "0" can be reversed with respect to FIG. 7.

Figure 8A:
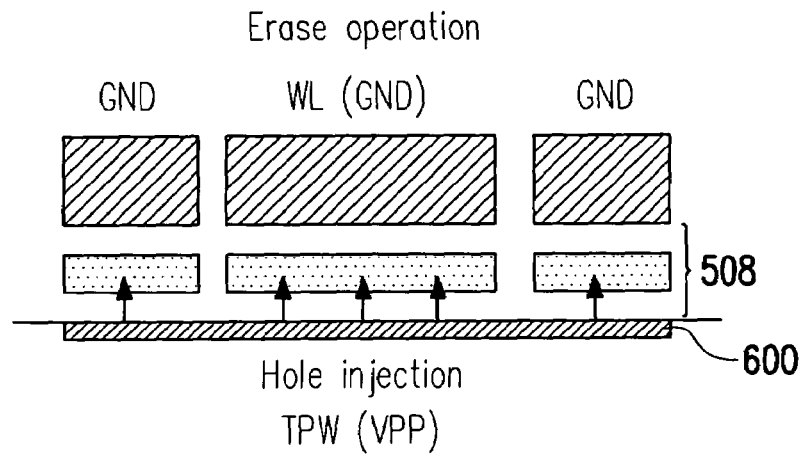
FIGS. 8A–8C are drawings, schematically illustrating the operation mechanism of the memory function, according to an embodiment of the invention.
Figure 8B:
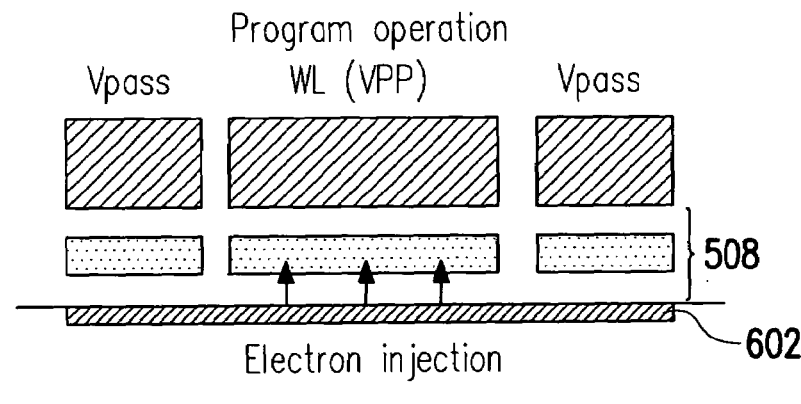
Figure 8C:
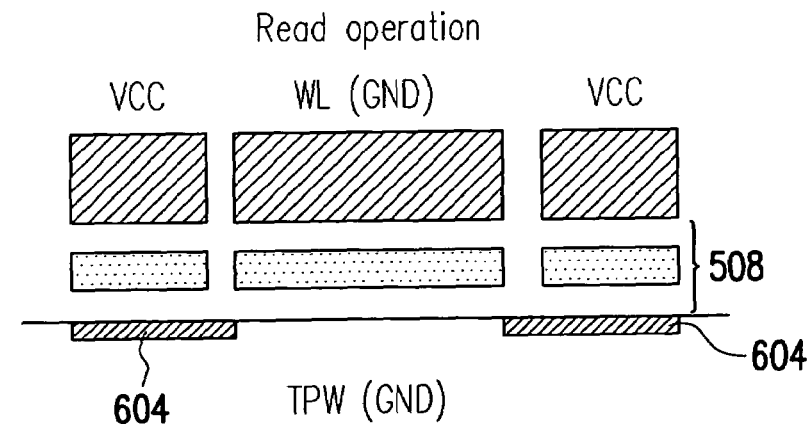

FIGS. 8A–8C are drawings, schematically illustrating the operation mechanism of the memory function. The operation of the memory basically includes programming, erasing, and reading. In FIG. 8A, when the memory is to be erased, all word lines can be applied a low voltage, such as a ground voltage GND, while the substrate is applied with a higher voltage Vpp. In this manner, the holes in the region 600 of the substrate are injected into the nitride layer of the ONO layer 508, so as to annihilate with the trapped electrons. The cells are cleared. For the flash memory, the whole block is usually eased at the same time.

In FIG. 8B, when the cell is to be programmed, the word line for the selected cell is applied with voltage VPP, and the other word lines are applied by the pass voltage. Here, the word lines are also the gate lines. As foregoing descriptions in FIG. 6A, the source region and the drain region can be extended to the sides of the selected word line WL. Since the selected word line WL is also applied with the voltage VPP, the junction region 602 in the substrate is created. Due to the electric-field force produced from the voltage VPP and the ground substrate, the electrons in the junction region 602 are injected into the nitride layer of the ONO layer 508. Then the trapped electrons change the threshold voltage for storing one binary data.

In FIG. 8C, when the cell is to be read, the gate (word line) for the cell to be read is applied to a low voltage, such as the ground voltage. The other gates (word lines) are applied with a voltage Vcc, so as to extend the S/D region to the side of the gate (word line WL). Based on whether or not the nitride layer has trapped electrons causing the difference of the threshold level, the binary data is read out. The operation voltages depending on the actual operation is, for example, listed in Table 2.

Figure 9:
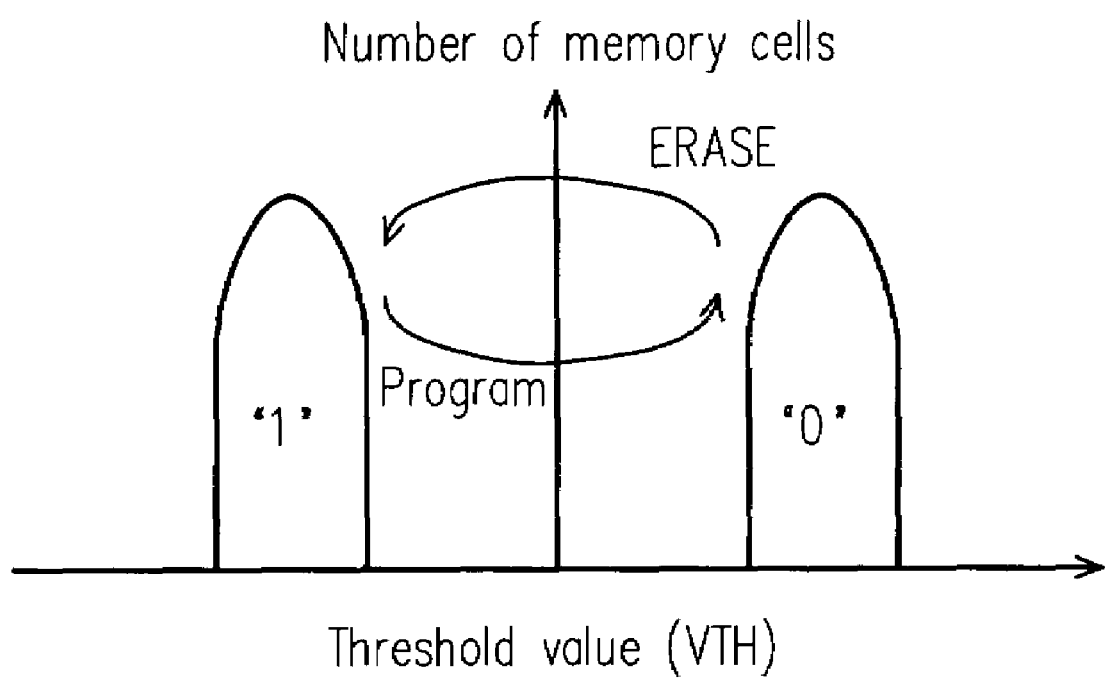
FIG. 9 is a drawing, schematically illustrating a content distribution for the memory device, according to another embodiment of the invention.
Figure 10A:
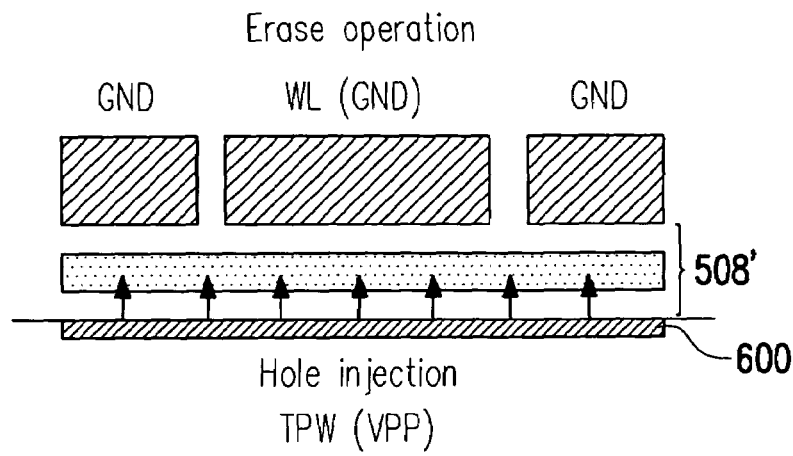
FIGS. 10A–10C are drawings, schematically illustrating the operation mechanism of the memory function, according to another embodiment of the invention.
Figure 10B:
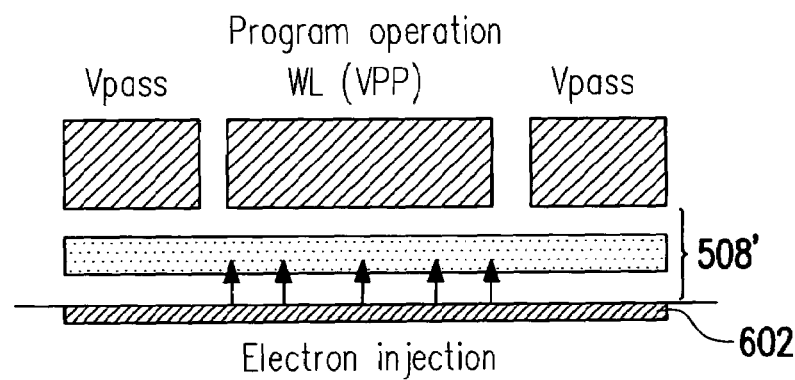
Figure 10C:
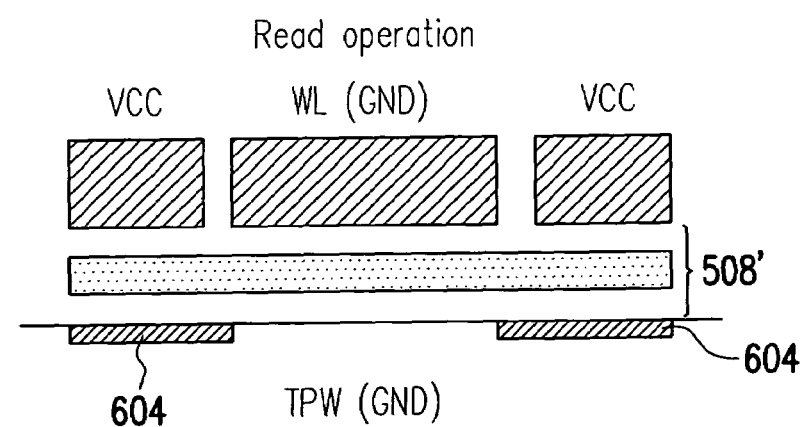

Alternatively, the ONO layer 508 as shown in FIGS. 8A–8C can be continuous. FIG. 9 shows the threshold relation for storing the binary data, and is similar to FIG. 7. FIGS. 10A–10C are also similar to FIGS. 8A–8C but the ONO layer 508' is continuous through the cells. In this situation, the electrons trapped in the nitride layer under the corresponding gate may be not so localized as done in FIGS. 8A–8C. However, it does not significantly affect the read operation to read the correct data.

Figure 11A:
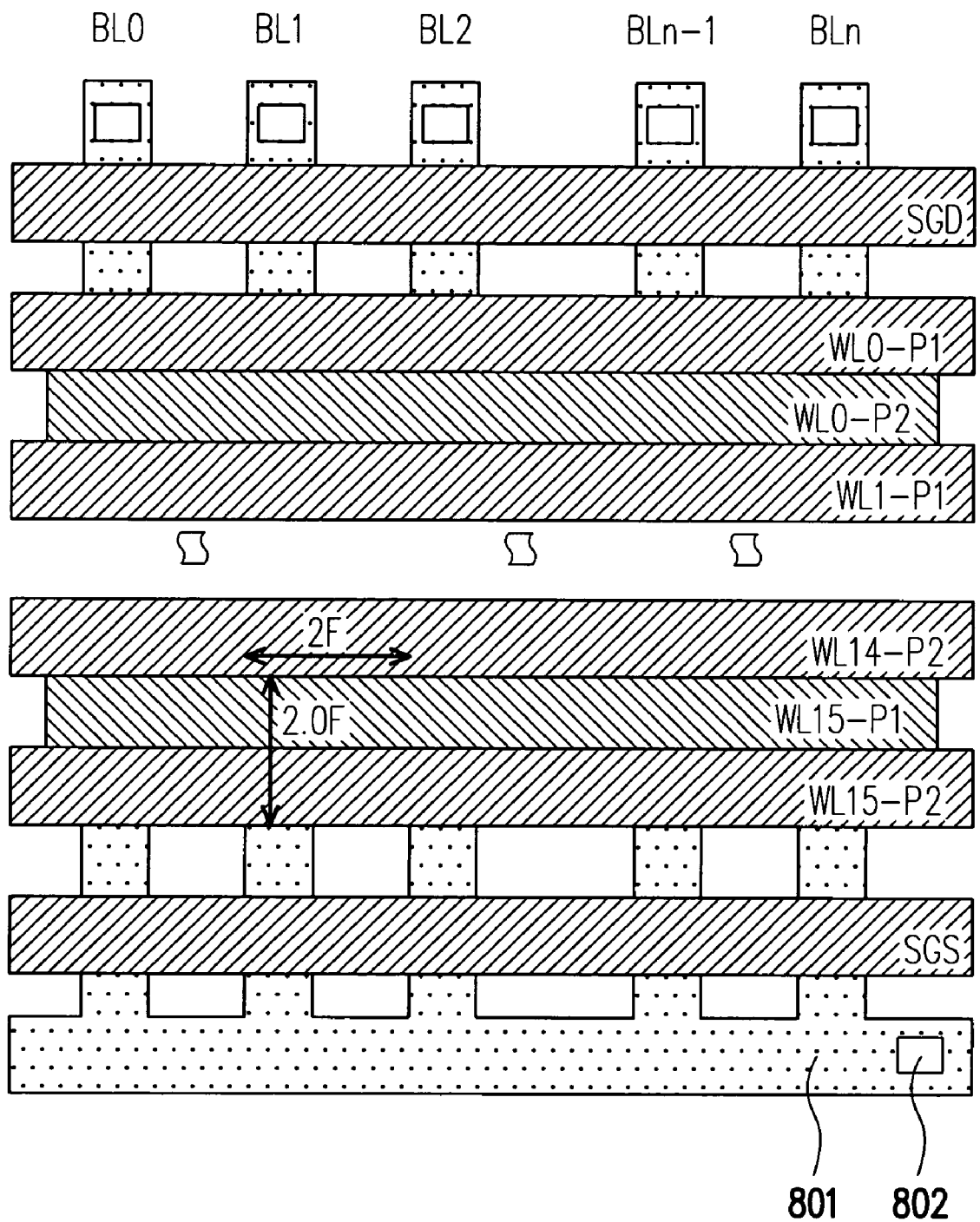
FIG. 11A is a top view, schematically illustrating the double-cell memory device memory device, according to another embodiment of the invention.
Figure 11B:
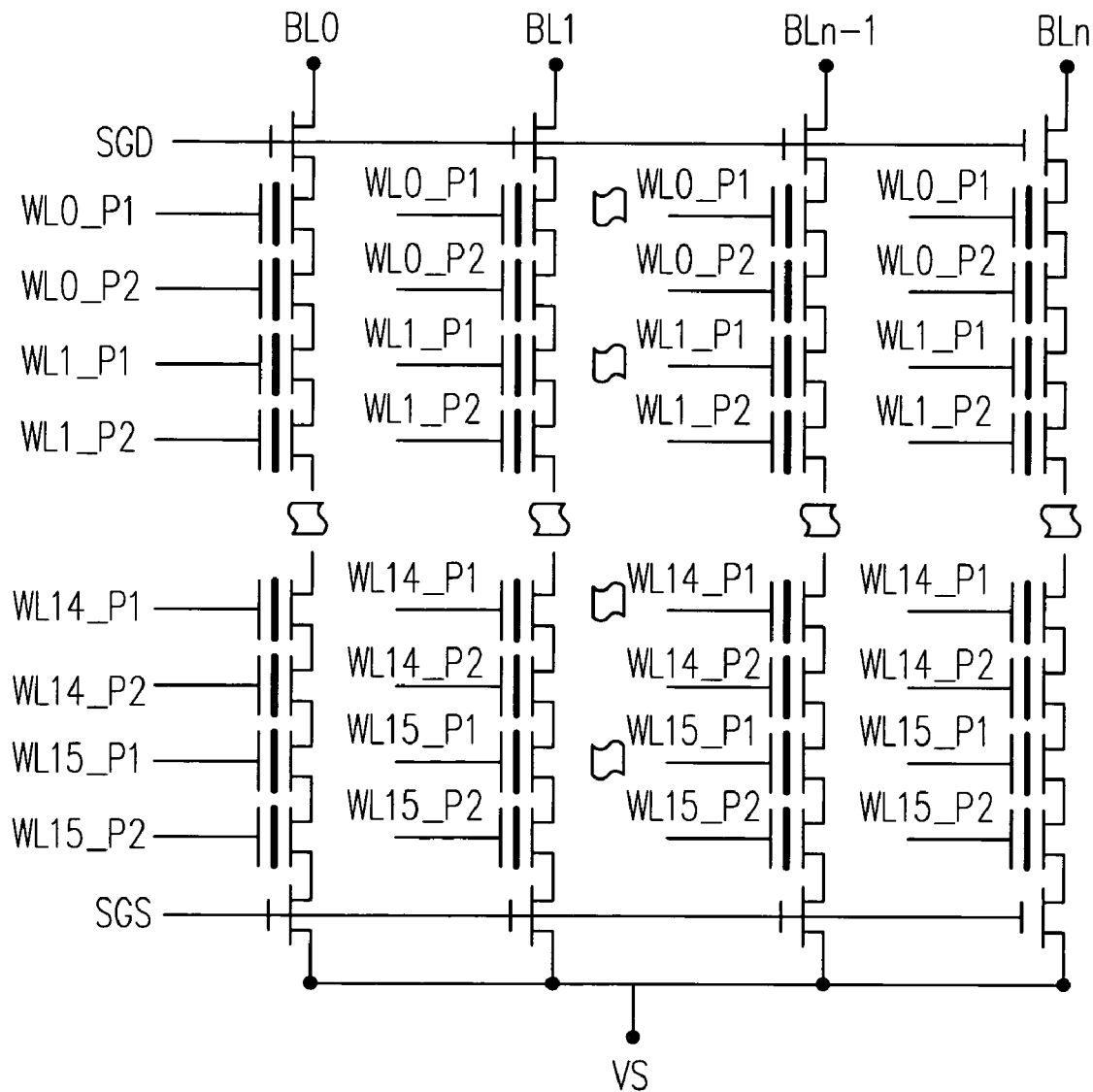
FIG. 11B is a drawing, schematically illustrating the circuit for the double-cell memory device in FIG. 11A, according to another embodiment of the invention.

For the layout of the memory device, the structure can be arranged as shown in FIG. 11A with the equivalent circuit FIG. 11B. In FIG. 11A, the memory cells are arranged into a two-dimensional array. Several cells in string are arranged to the same bit line BL0, BL1, . . . BLn. Taking the cell string belonging to one bit line as the example for description. One bit line BL0 is coupled to the doped region 801 beside the selection gate SGD, serving as the drain region. The other doped region, serving as another S/D region, is located another side of the selection gate SGD. It is similar for the selection transistor with the selection gate SGS. However, one S/D region is coupled to the source line through the plug 802. In other words, the selection transistors also provide the S/D region for the memory cells. The memory cells has no S/D region.

Continuously, several gate lines, that are, world lines WL0-P1, WL0-P2, WL1-P1, WL1-P2, . . . W15-P1, WL15-P1, are adjacently arranged together. Here, 16 word lines in two group are taken as the example. It is not necessary to be limited the number of 16. The cross-sectional view along the bit line direction is shown in FIG. 6A. The word lines in P1 group is alternating positioned with the word lines in P2 group. For example, for word line WL0, there are two cells in P1 and P2, called double-cell. However, the two groups, each with 16 word, can also be treated as 32 word lines in sequence. This is depending on the actual operation. For the double-cell structure, the driving circuit (not shown) can be design to select the WL0-P1 or WL0-P2 without problem. In other words, the S/D regions for the typical MOS transistor are saved in the invention. Instead, the pass gates are formed.

Figure 1B:
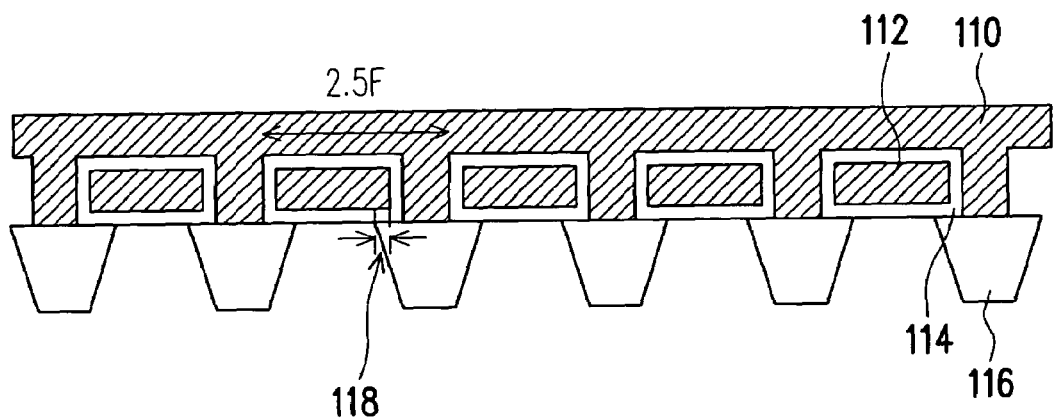
Figure 2A:
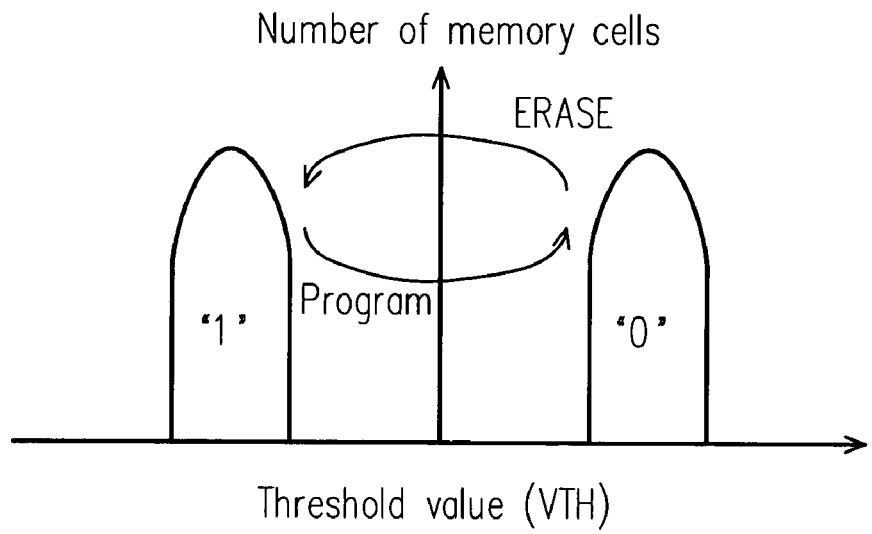
FIG. 2A is a drawing, schematically illustrating the content distribution of the memory cells with floating gate in stack-gate design.
Figure 2B:
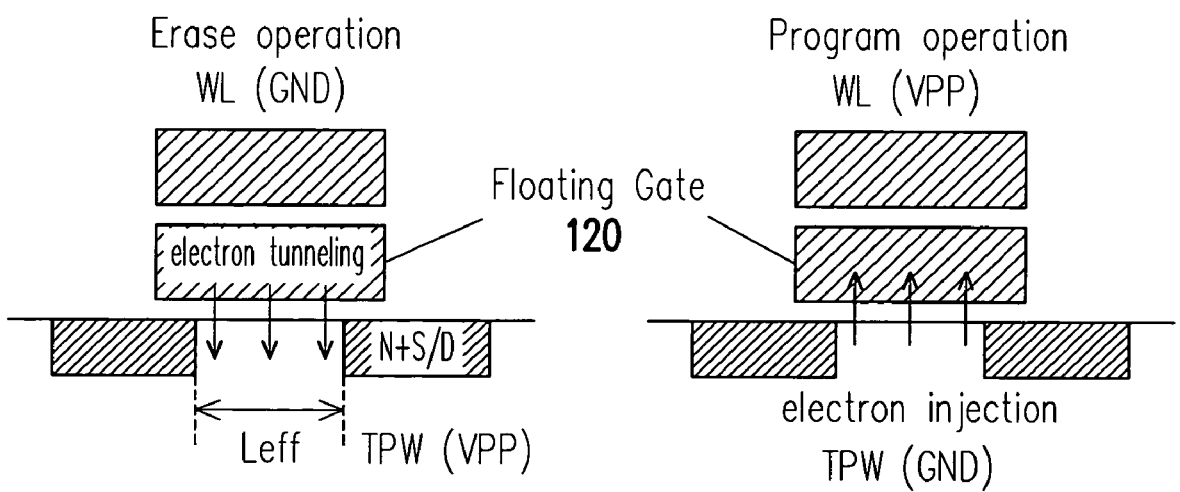
FIG. 2B is a drawing, schematically illustrating the operation mechanism for the memory cell with floating gate in stack-gate design.
Figure 3A:
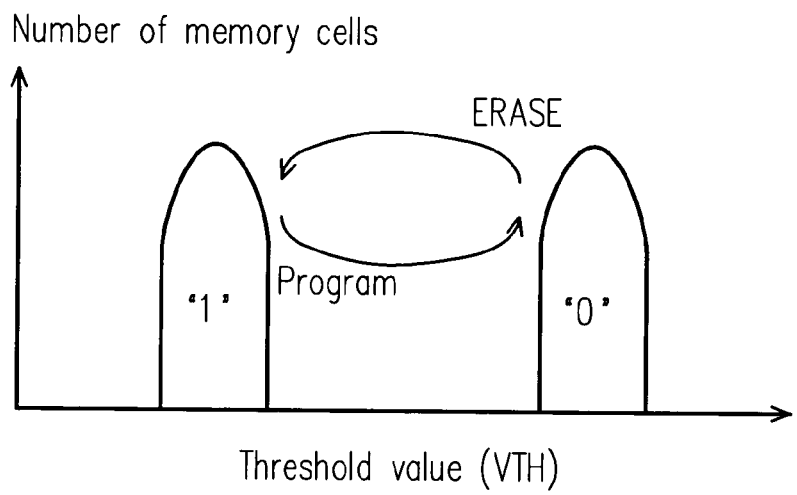
FIG. 3A is a drawing, schematically illustrating the content distribution of the memory cells with O/N/O dielectric layer design of NOR type SONOS device.
Figure 3B:
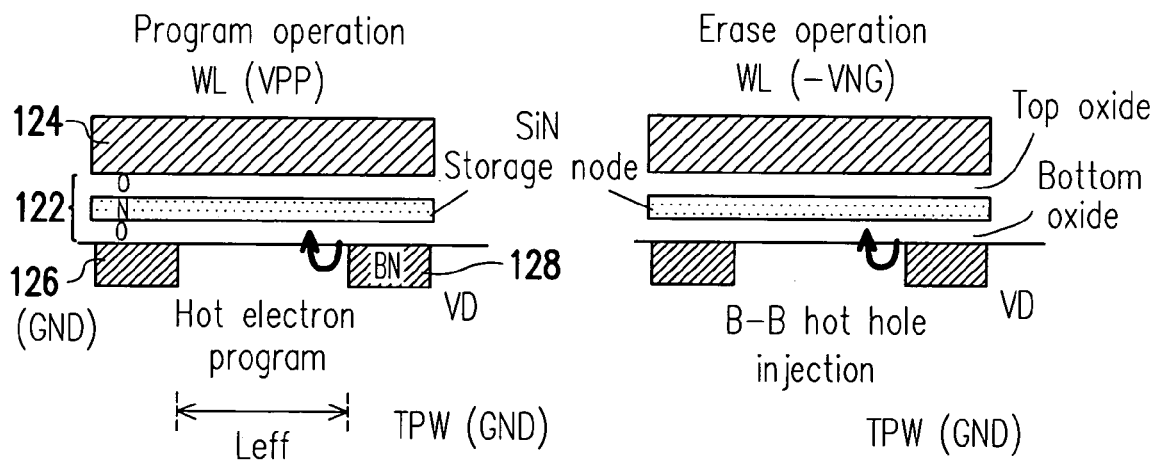
FIG. 3B is a drawing, schematically illustrating the operation mechanism for the memory cell of SONOS memory cell.
Figure 4A:
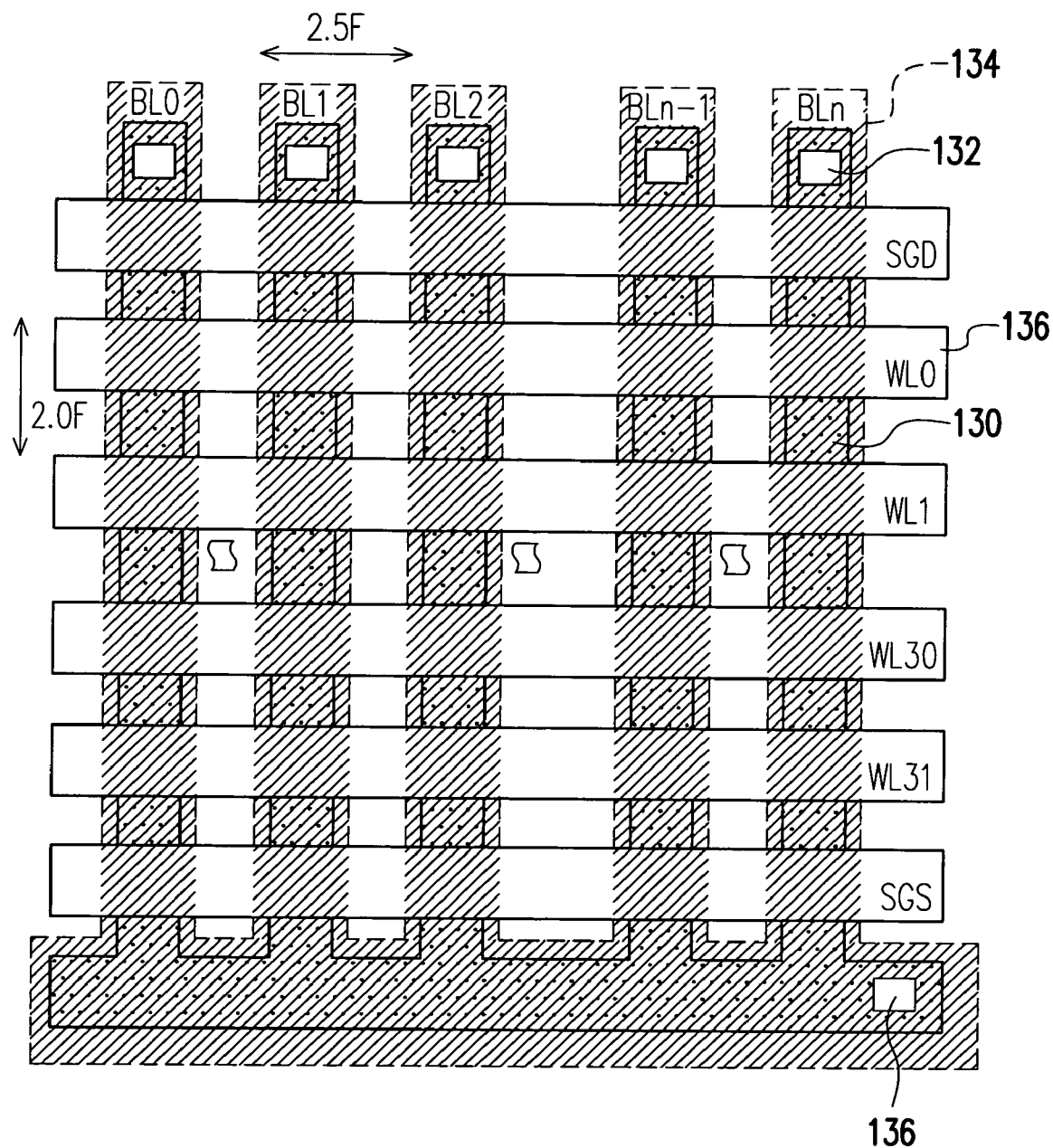
FIG. 4A is a top view, schematically illustrating the conventional stack gate NAND flash memory.
Figure 4B:
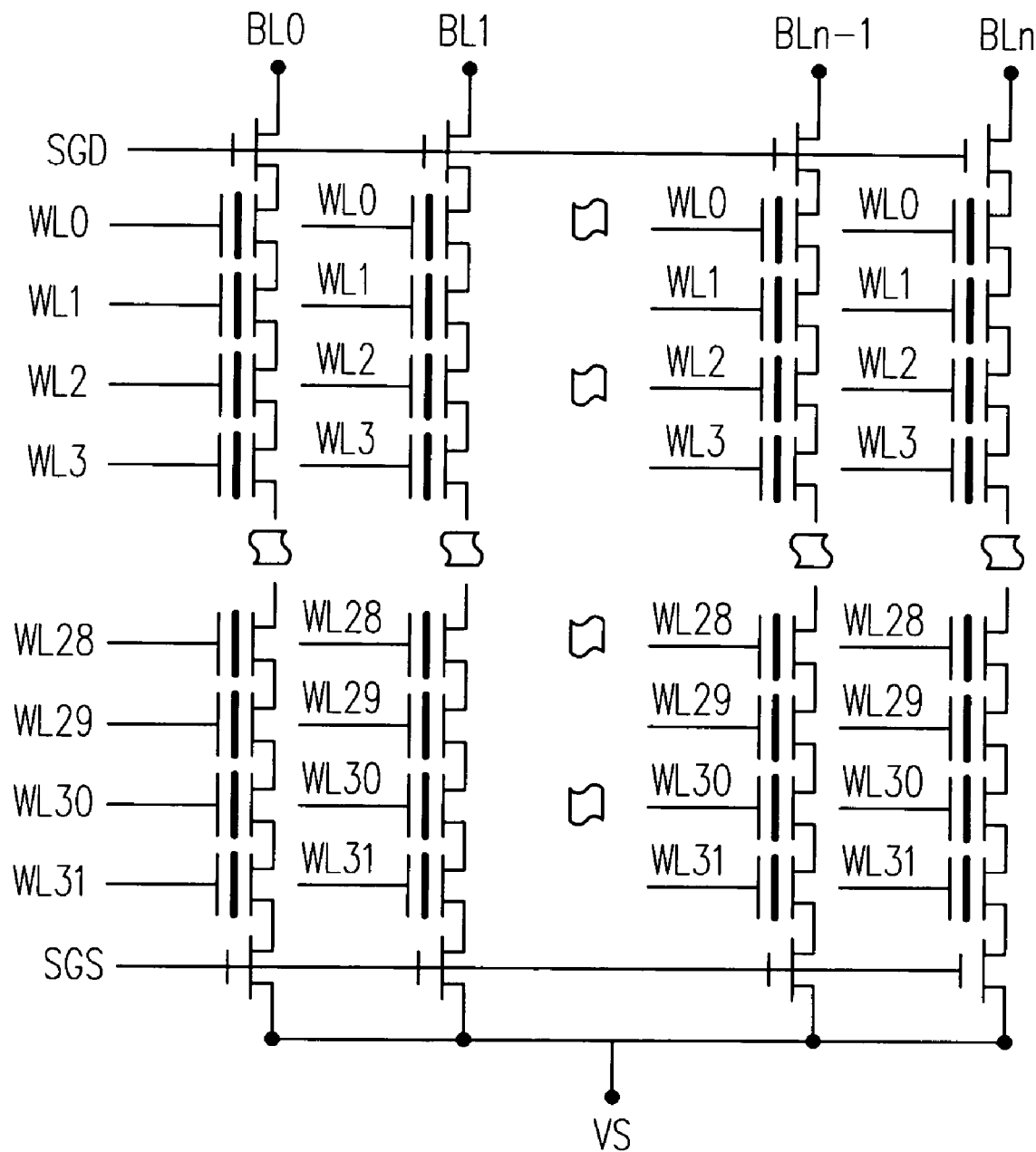
FIG. 4B is a drawing, schematically illustrating a circuit for the conventional NAND flash memory with respect to FIG. 4A.

In FIG. 11B as one example, each word line has two cells by P1 and P2. The conventional S/D electrode between the word lines can be saved. Once one word line is selected, the other word lines serves as the pass gates to extend or pass the S/D regions from the selection gate to the gates adjacent to both sides of the selected gate. In this situation the cell size is reduced to about half, such as (2 F×2 F)/2=2 $F^2$. Here, since the alignment with the STI is not necessary, it can for example further reduce 0.5 F as mentioned in FIG. 1B.

For the example in FIG. 11B, the operation voltages for erase, program, and read are for example listed in Table 2.

TABLE 2

Device operation of Double NAND Flash memory cell. For example, NAND string cell have two groups (SONOS-P1, SONOS-P2) of SONOS NAND cells, and each group has four SONOS Flash cells.

| NODE | ERASE | Program (selected) | Program (non-selected) | Read |
|---|---|---|---|---|
| BL | FG | GND | VCC | 1 V |
| SGD | FG | VCC | VCC | VCC |
| SONOS-P1-WL0 | GND | Vpass | Vpass | VCC |
| SONOS-P2-WL0 | GND | Vpass | Vpass | VCC |
| SONOS-P1-WL1 | GND | Vpass | Vpass | VCC |
| SONOS-P2-WL1 | GND | Vpass | Vpass | VCC |
| SONOS-P1-WL2 (selected WL) | GND | VPP | VPP | GND |
| SONOS-P2-WL2 | GND | Vpass | Vpass | VCC |
| SONOS-P1-WL3 | GND | Vpass | Vpass | VCC |
| SONOS-P2-WL3 | GND | Vpass | Vpass | VCC |
| SGS | FG | GND | GND | VCC |
| VS | FG | GND | GND | GND |
| P-WELL | VPP | GND | GND | GND |

Note:
for example, VPP value is from 8 to 20 V. Vpass value is from VCC to 12 V

Referring to FIG. 6A, FIG. 11A, and FIG. 11B, for the erase Operation, the block erase or whole chip erase is performed by applying a high voltage VPP on TP-well and DN-well, and keeping all of the word lines of SONOS-P1 and SONOS-P2 to a ground voltage GND. Bit line BL, Source line, SGD and SGS are in Floating or VPP that can prevent high electric field from crossing gate and S/D junction of selection transistor region. While the high electric filed is across the ONO layer of the SONOS cell, it causes the F-N hole injection from the substrate through the bottom tunnel oxide into SiN storage node, and causing cell threshold voltage down to negative value that is defined as "1" state, for example.

Alternative way of erase operation is negative gate erasing by applying negative voltage on control gate, and all of the others terminal GND.

For the program operation, in which the SONOS-P1 cell is to be programmed as the example, byte or page programming and program verification is applied on the selected cell. The high voltage VPP is applied to the selected word line of SONOS-P1, the other unselected WL's of SONO-P1 and word lines of SONO-P2 are performing as the pass gate transistor (biased to Vpass) to pass BL voltage (GND) to the channel of selected program cell. A high electric filed then exits on ONO film of programmed cell to induce the F-N electrons, tunneling from the substrate into nitride storage node. The threshold voltage of the program cell therefore increases to the positive value that is defined as "0" state, for example.

In regarding to the program disturbance, the same WL of program inhibit cells can be alleviated from the program disturbance because of the unselected BL voltage is held at VCC that will pass to the channel of program inhibited cell. This program inhibited cell can prevent word line disturbance. On the other hand, program inhibited cells in the same BL can prevent program disturb due to the gate voltage Vpass that does not cause electron tunnel through tunnel oxide.

For the read operation, in which the SONOS-P1 cell is to be programmed as the example, the selected bit line BL is applied to a relative low voltage, such as about 1V. The selected word line of the selected cell, such as SONOS-P1 cell, is held at a low voltage, such as ground voltage GND, while the other word line of un-selected cells of SONOS-P1 cells and SONOS-P2 cells are biased at pass voltage, such as VCC, and the source is, for example grounded to GND.

Figure 11C:
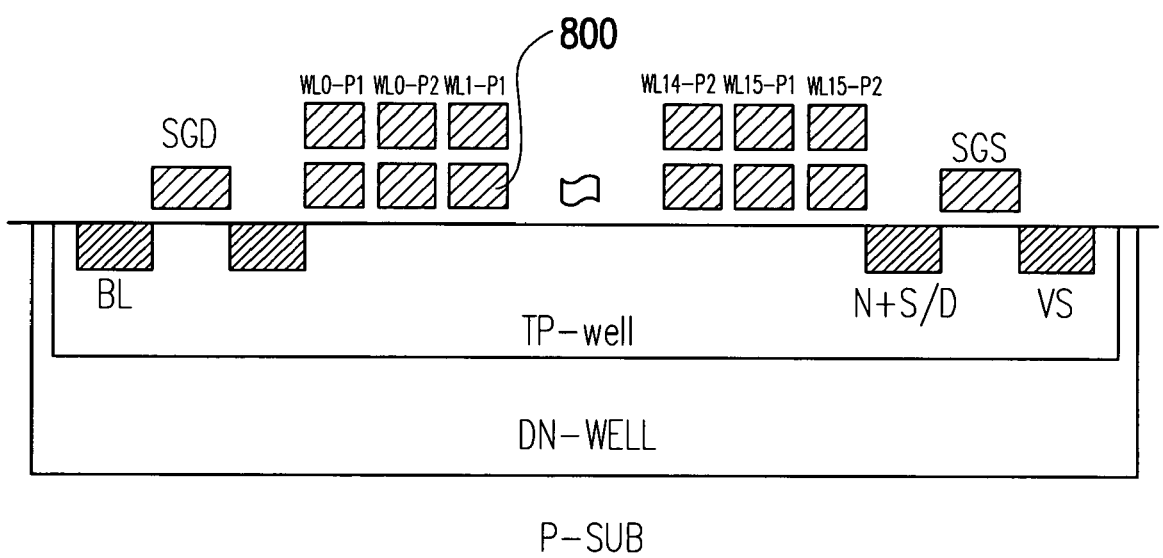
FIG. 11C is a cross-sectional view, schematically illustrating an alternative structure with respect to the circuit in FIG. 11B.

The operation voltages can be changed according to the actual design. With the same design aspect, it is not necessary to be limited to the SONOS memory cell. FIG. 11C shows the alternative memory cells with the stack-gate design. The equivalent circuit is also shown in FIG. 11B, but the memory function is provided by the floating gate 800. In this situation, the operation voltages may change but the storing mechanism is understandable for the ordinary skilled artisans.

Figure 12:
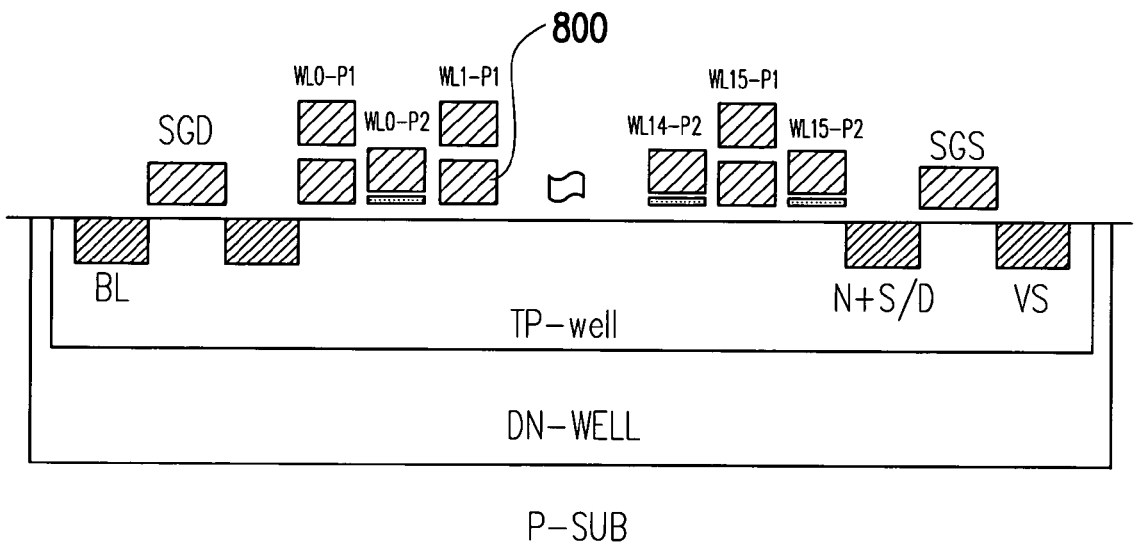
FIGS. 12–18 are cross-sectional views, schematically illustrating various designs, according to another embodiment of the invention.
Figure 13:
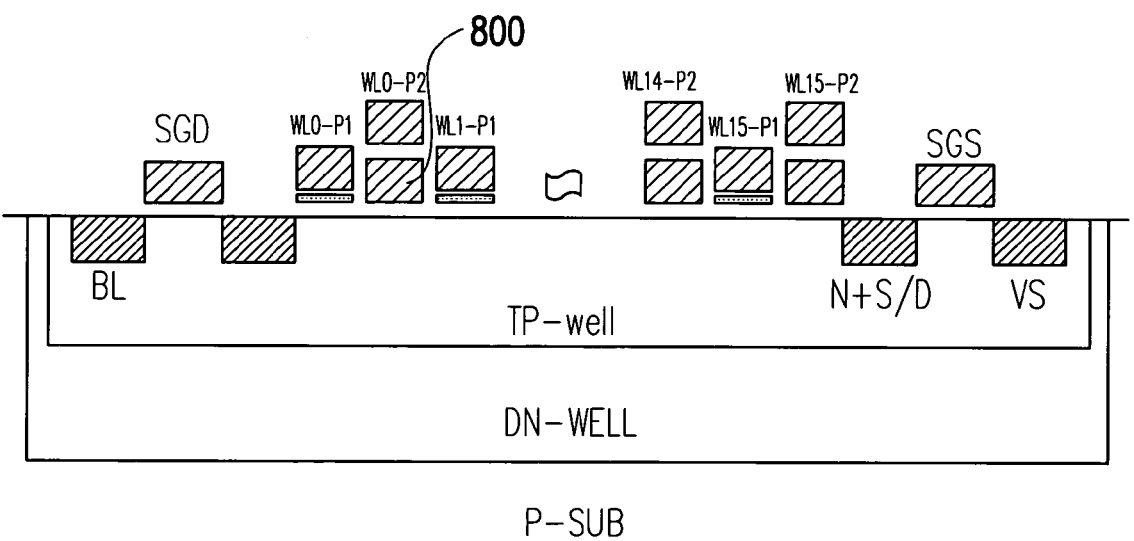

With the same operation mechanism, the memory cells can include both the stack-gate cells and the SONOS cells as shown in FIG. 12 and FIG. 13. In FIG. 12, the equivalent circuit is the same. However, for example, the group P1 is in stack-gate cells while the group P2 is in SONOS cells. In FIG. 13, for example, the group P1 is in SONOS cells while the group P2 is in stack-gate cells. Preferably, the group P1 and the group P2 are alternatively disposed but the invention is not limited to this arrangement. In this design, the operation voltages on the selected gate and the un-selected gates may be different but the feature of pass gate still exits.

Figure 14:
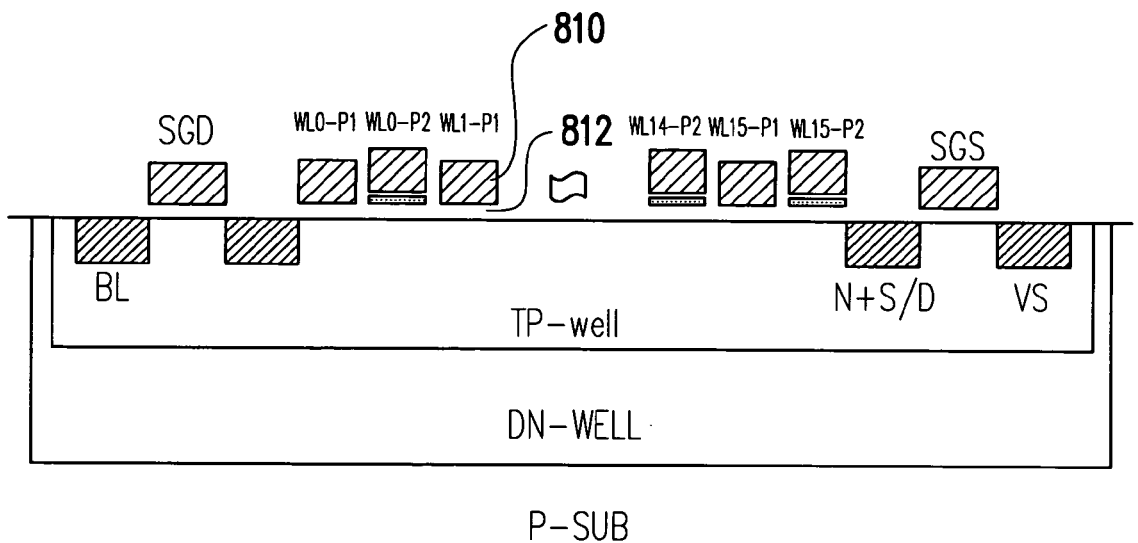
Figure 15:
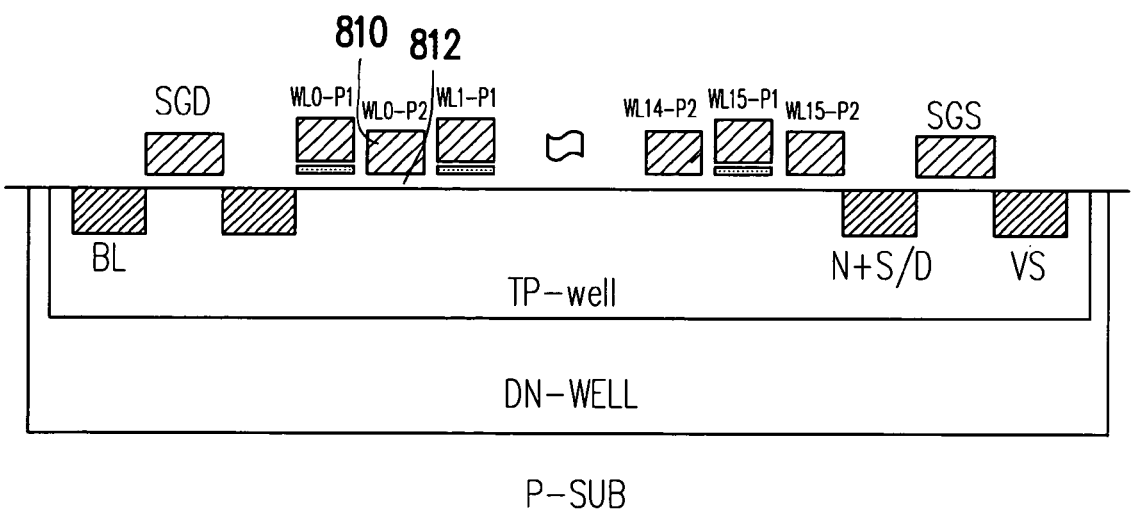

For another design of the memory array, it is not necessary to use all of the gates for memory function. In general, it may be sufficient to use at least a potion of the gates for memory function. In this situation, the gate not for memory function can be a simple gate structure with a gate electrode and a single gate dielectric layer on the substrate. In FIG. 14, the gates 810 in group P1 can be the usual gate structure with the gate dielectric layer 812 between the gate 810 and the substrate P-sub. The gate 810 are used for pass gate. The gates in group P2 are the SONOS gates, used for memory function. In FIG. 15, The group P1 and the group P2 are reversed, then the group P1 is used for memory function. Again, it is not necessary that the group p1 and the group P2 are alternatively disposed.

Figure 16:
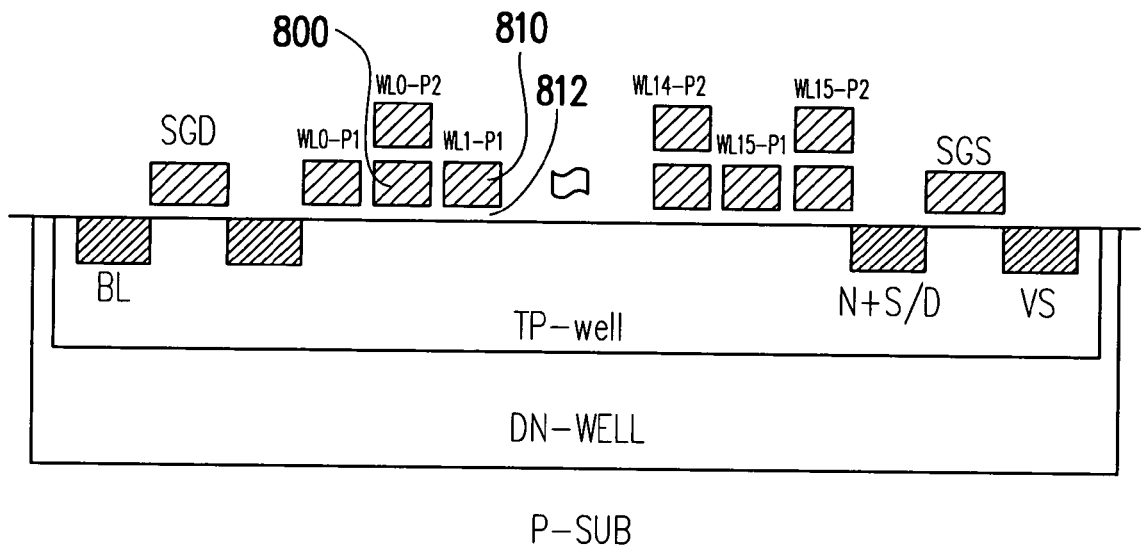
Figure 17:
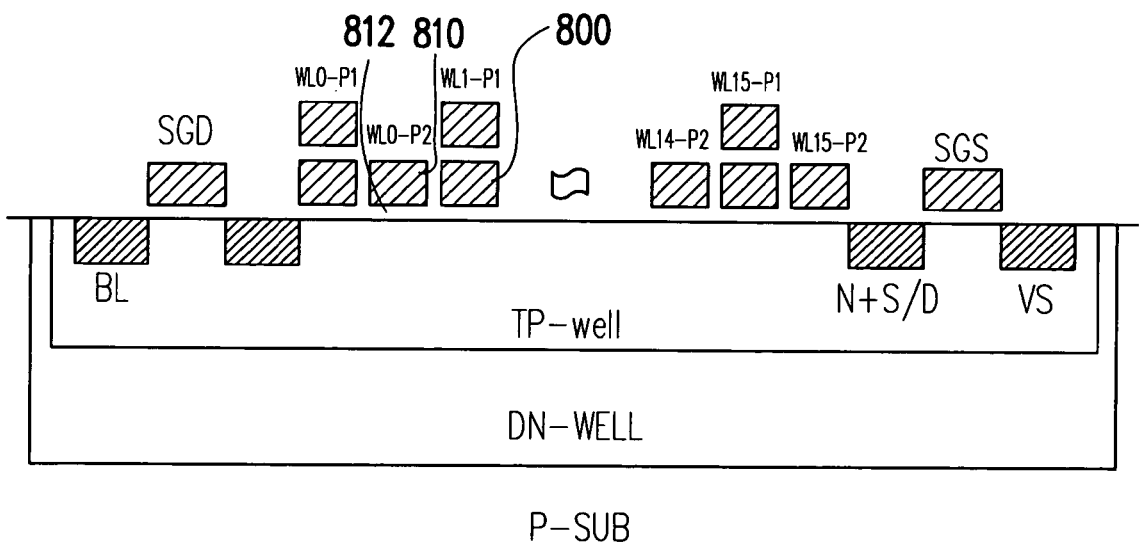

Alternatively, the SONOS gates in FIGS. 14 and 15 can be replaced by the stack gate structure with the floating gate 800. In FIG. 16, the SONOS gate structures for the group P2 in FIG. 14 are replaced with the stack gate structure. In FIG. 17, the SONOS gate structures for the group P1 in FIG. 15 are replaced with the stack gate structures.

Figure 18:
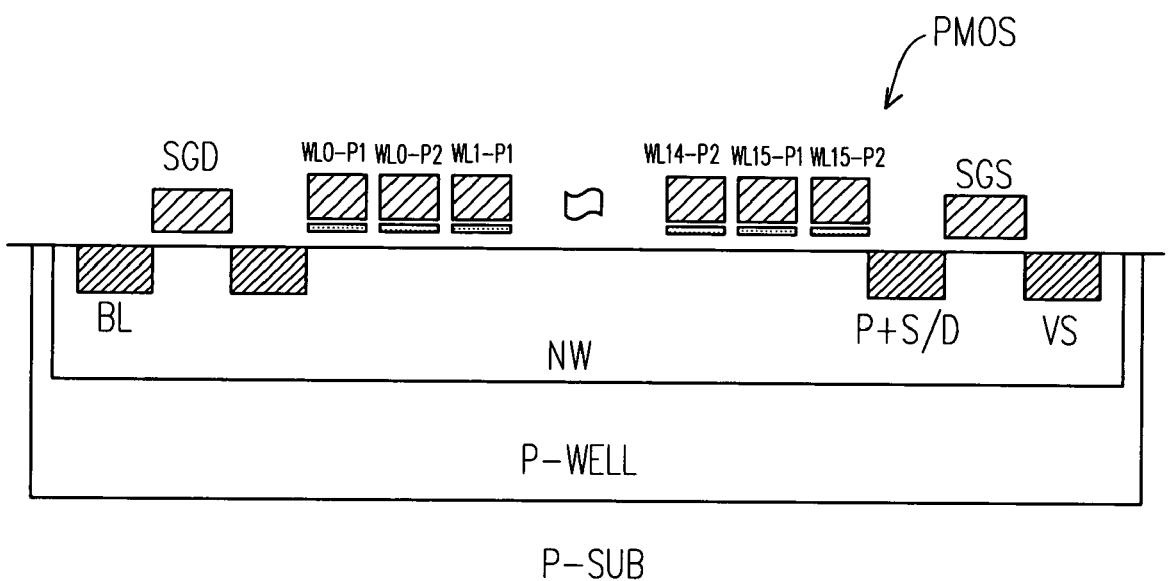

Alternatively, in semiconductor structure, the same circuit can be equivalently designed with the N-type MOS device or the P-type MOS device. The difference is the operation voltages. For the invention, the semiconductor structure, for example in FIG. 6A, can be changed into the PMOS design as shown in FIG. 18. The electric type of the semiconductor is reversed. In this situation, the operation voltages are different, but the features of pass gate still remain. The semiconductor structures in FIGS. 12–17 are NMOS devices formed on the P-type well. However, the NMOS devices can be changed into the PMOS devices. Then the operation voltages are accordingly changed and should be known by the ordinary skilled artisans, so as to accordingly change the threshold values for storing binary data.

Figure 19A:
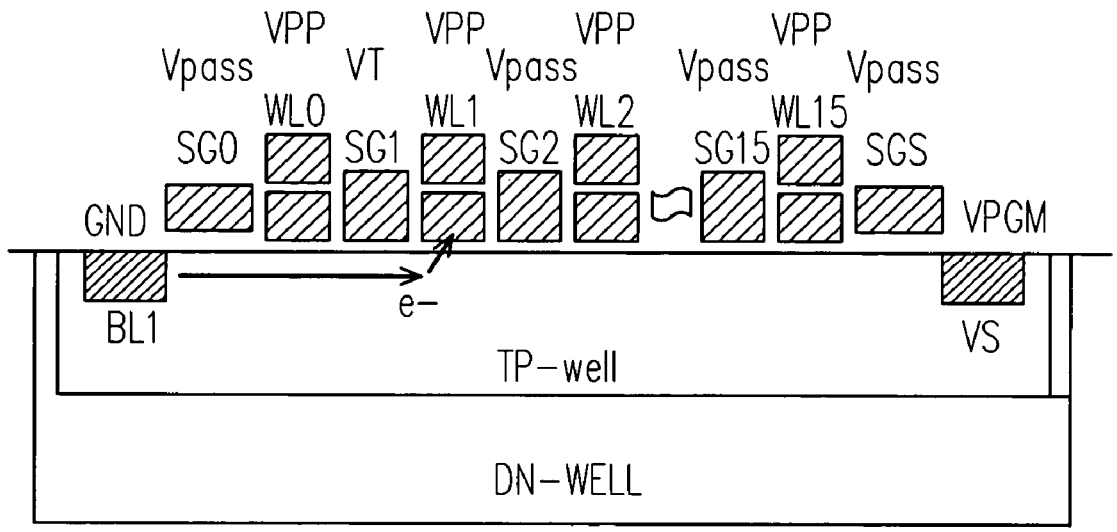
FIGS. 19A–19B are cross-sectional views, schematically illustrating another design in Stack Gate NAND cell, according to another embodiment of the invention.
Figure 19B:
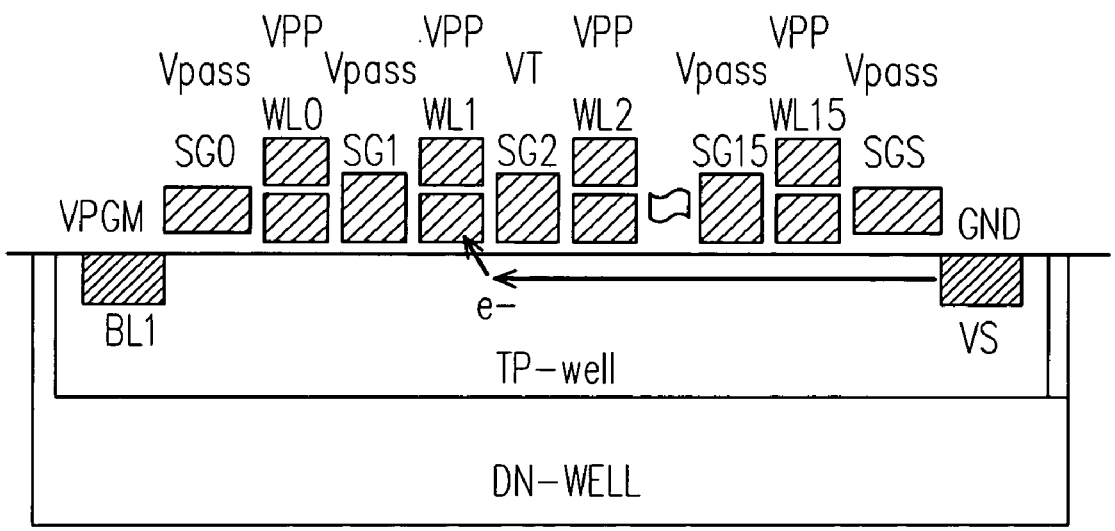
Figure 20A:
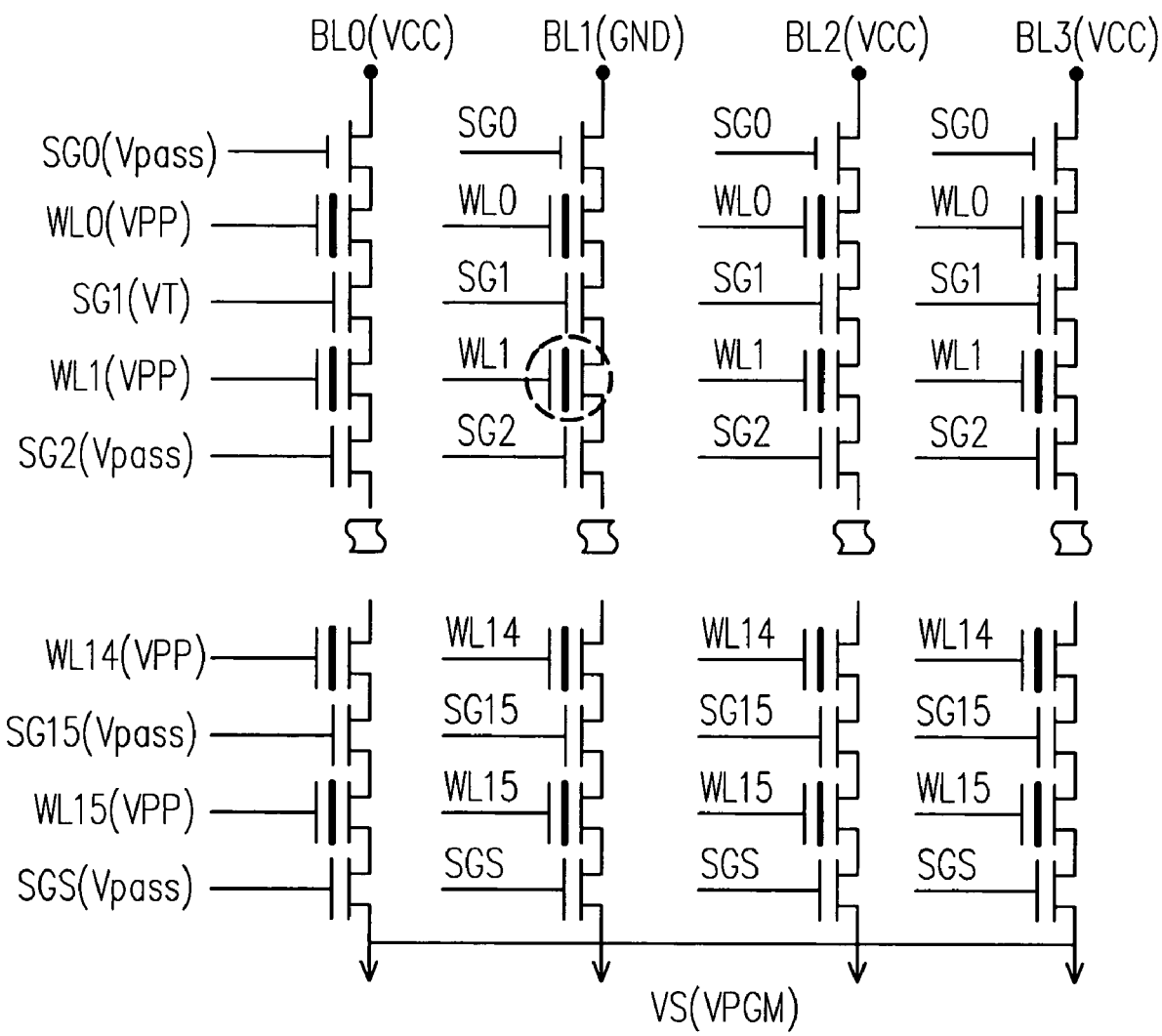
FIGS. 20A–20B are circuit diagrams, schematically illustrating the operation with respect to FIGS. 19A–19B.

Alternatively, for the stack-gate NAND cell, the actual design and operation are shown in FIGS. 19A–19B and FIGS. 20A–20B. In FIG. 19A, the structure is similar to the structure in FIG. 16 but the selection gate has modified without an actual transistor or an additional doped region. For the operation, if the indicated cell with respect to word line WL1 and bit line BL1 is to be accessed as an example shown in FIG. 20A, the operation voltages for the situation in FIG. 19A and FIG. 20A are listed in Table 3. In this design, it should be noted that the selection gate SG1 is applied by the voltage just above the threshold voltage VT, while all the word lines are applied with the relative higher voltage VPP. In this situation, the ground voltage GND is passed to the position under the selection gate SG1. The programming voltage VPGM from the source VS is passed to the position under the selected word line WL1. In this situation, since the voltage VT is much smaller than the voltage of VPGM, a strong electric filed is created at the gape, then electrons are injected into the floating gate of the stack gate WL1.

TABLE 3

Device operation of NAND Flash memory cell with split gate structure.

| NODE | ERASE | Program-1 (selected) | Read |
|---|---|---|---|
| BL | FG | GND | VBL |
| SGS | FG | VPASS | VCC |
| Selected WL | VNG/GND | VPP | GND/VR |
| Un-selected WL | GND | VPP | VCC |
| Selected SG | FG | VT | VCC |
| Un-selected SG | FG | VPASS | VCC |
| Un-selected BL | FG | GND | GND |
| VS | FG | VPGM | GND |
| TP-WELL | VPW | GND | GND |

Note:
VPP value is from 8 to 16 V.
VPASS value is around 5–12 V.
VPGM is from 3 to 8 V.
VBL is from 0.6 to 2 V
VT is threshold voltage of select gate device, such as about 1 V.
VNG is from −3 to −12 V.
VPW is from 6 to 20 V.
VR is 0 to 2 V.

Figure 20B:
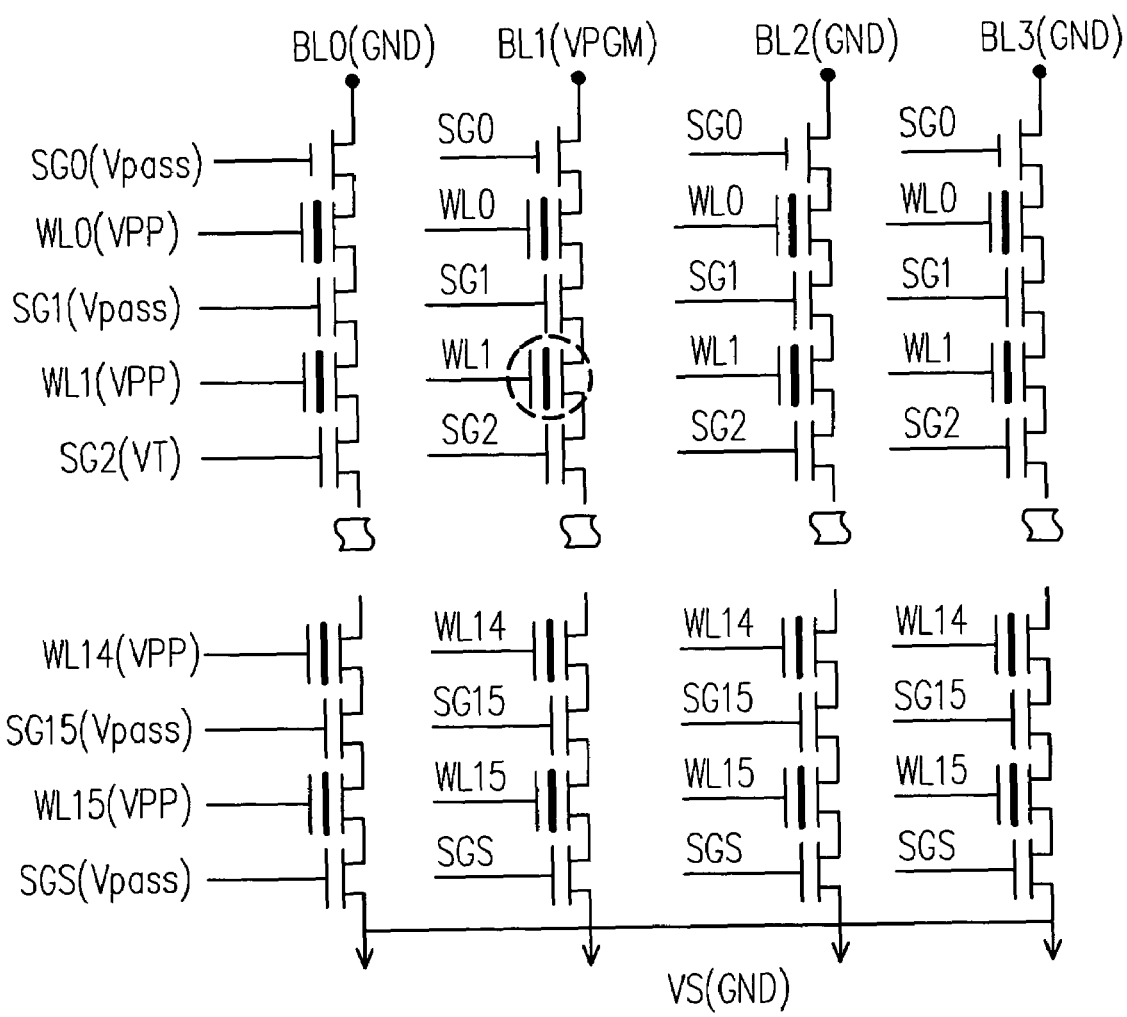

Alternatively, since the structure is symmetric, the operational direction can be reversed, as shown in FIG. 19B and FIG. 20B. In FIG. 19B and FIG. 20B, the bit line BL1 is applied by the voltage VPGM wile the source VS is applied by the ground voltage GND. The selection gate SG2 is now at the voltage of VT. The operation voltages are listed in Table 4.

TABLE 4

Device operation of NAND Flash memory cell with split gate structure.

| NODE | ERASE | Program-2 (selected) | Read |
|---|---|---|---|
| BL | FG | VPGM | VBL |
| SGS | FG | VPASS | VCC |
| Selected WL | -VNG/GND | VPP | GND/VR |
| Un-selected WL | GND | VPP | VCC |
| Selected SG | FG | VT | VCC |
| Un-selected SG | FG | VPASS | VCC |
| Un-selected BL | FG | GND | GND |
| VS | FG | GND | GND |
| TP-WELL | VPW | GND | GND |

The design in FIGS. 19A–19B also uses the selection gate to control the access. As a result, it has been sufficient with two doped regions. Further still, in better general, the selection gate SGS neat to the VS terminal can be further omitted without affecting the features of the invention. In other words, it has been sufficient to have the selection gat SGO near the bit line.

Figure 21A:
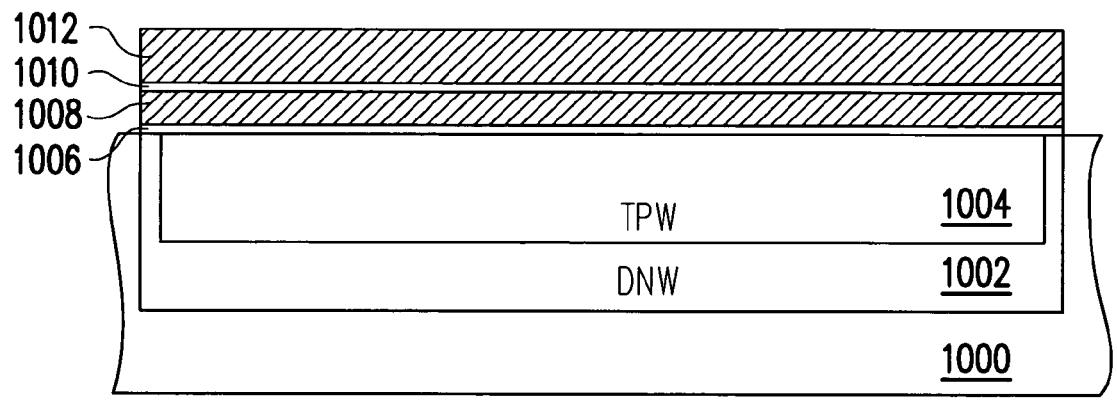
FIGS. 21A–21H are cross-sectional views, schematically illustrating the fabrication process with respect to the structure in FIG. 19A.

FIGS. 21A–21H are cross-sectional views, schematically illustrating the fabrication process with respect to the structure in FIG. 19A. In FIG. 21A, a substrate 1000 has the D-type well (DNW) 1002, and the T-type well (TPW) 1004. A tunnel oxide layer 1006 is formed over the substrate 1000 with a thickness of, for example, about 6 nm–110 nm. The tunneling oxide layer is used to allow electrons to tunnel through under the F-N operation. A polysilicon layer 1008 is formed over the tunneling oxide layer 1006 with a thickness of for example about 800–1500 angstroms. A dielectric layer such as O/N/O dielectric layer 1010 is formed over the polysilicon layer 1008. A polysilicon layer 1012 is formed over the O/N/O dielectric layer 1010 with a thickness of for example about 1200–2500 angstroms.

Figure 21B:
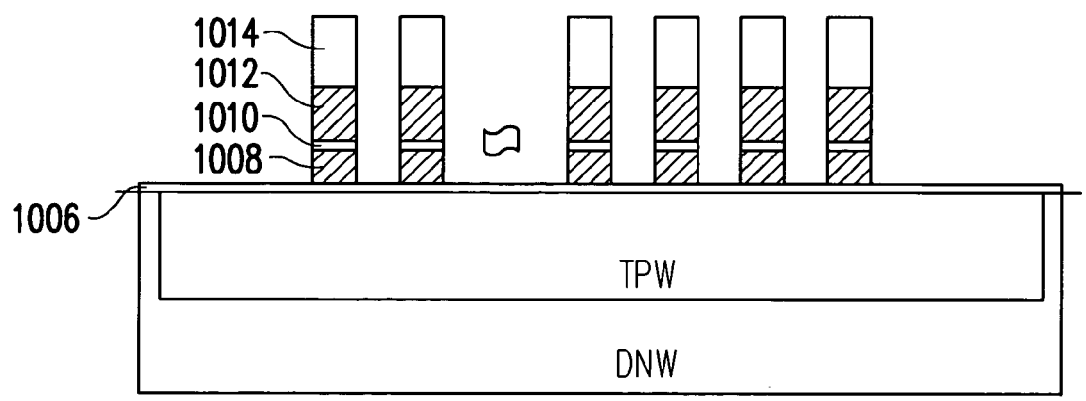

In FIG. 21B, the patterned photoresist layer 1014 is formed over the polysilicon layer 1012 to serve as an etching mask. Then, an anisotropic etching process is performed to expose the tunneling oxide layer 1006. The remaining portion of the polysilicon layer 1008 and 1012 form the stack gate structure.

Figure 21C:
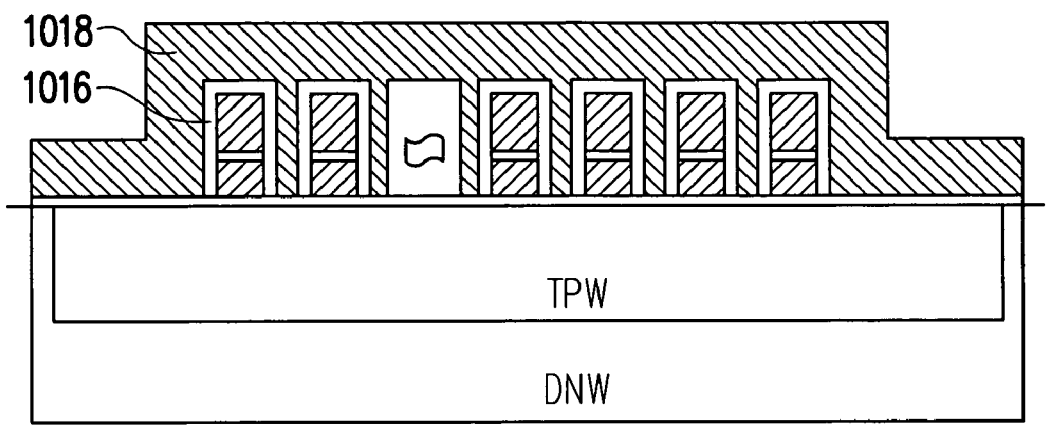

In FIG. 21C, after removing the photoresist layer 1014, a oxide layer 1016 is formed over the exposed peripheral surface of the polysilicon layers 1008 and 1012 by, for example, the oxide layer can be thermal oxidation or deposition. The thickness is for example 100–300 angstroms. Then a conductive layer, such as polysilicon layer 1018, is formed over the stack gates structure.

Figure 21D:
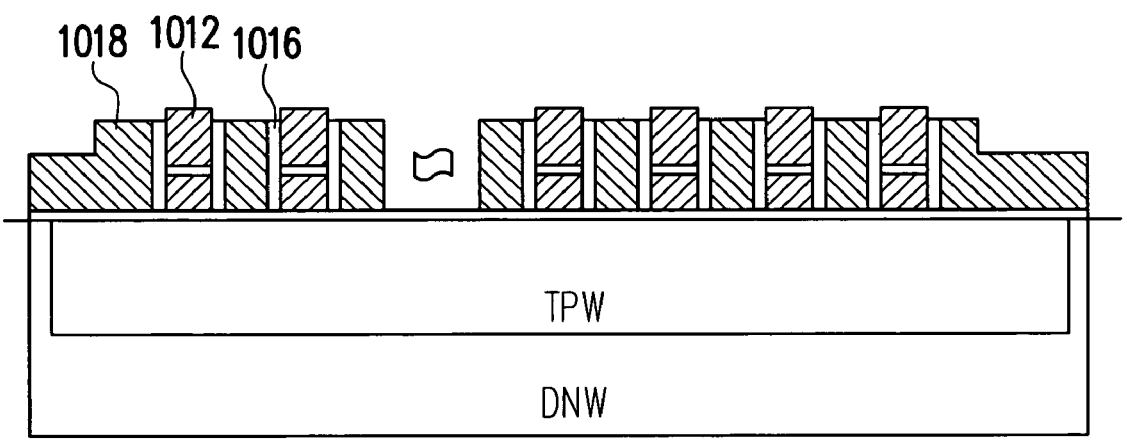

In FIG. 21D, an etching back process or chemical mechanical polishing (CMP) process is performed to remove the top portion of the polysilicon layer 1018 and expose the polysilicon layer of the stack gate structure. Preferably, the height of the polysilicon layer 1018 is lower than the height of the stack gate structure. Here, the remaining portion of the polysilicon layer 1018 serving as the selection gate and is isolated from the stack gate structure by the oxide layer 1016.

Figure 21E:
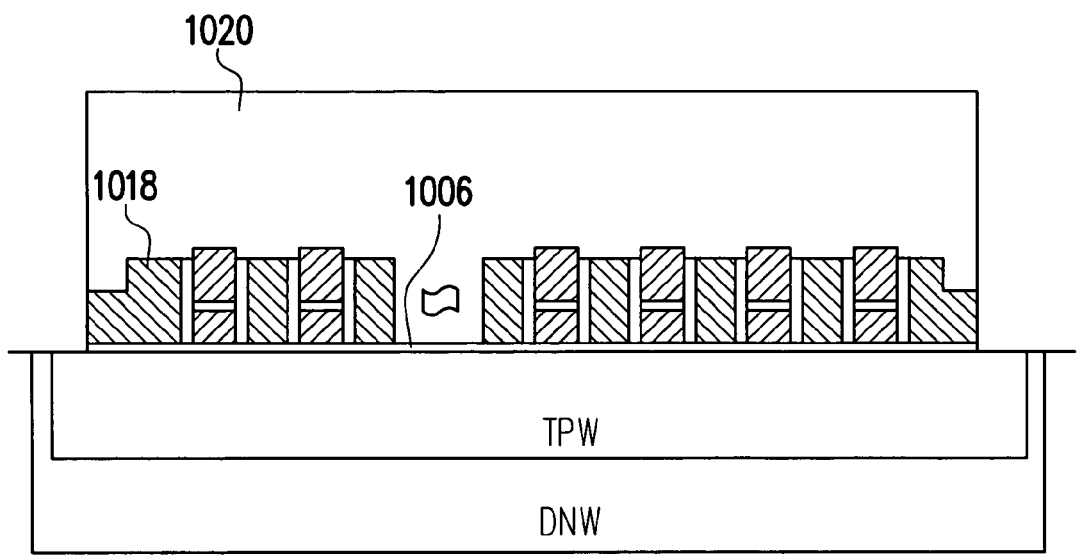

In FIG. 21E, a photoresist layer 1020 is formed over the substrate to serve as the etching mask. Then, the etching back process is performed to remove a portion of the polysilicon layer 1018 at the side portion.

Figure 21F:
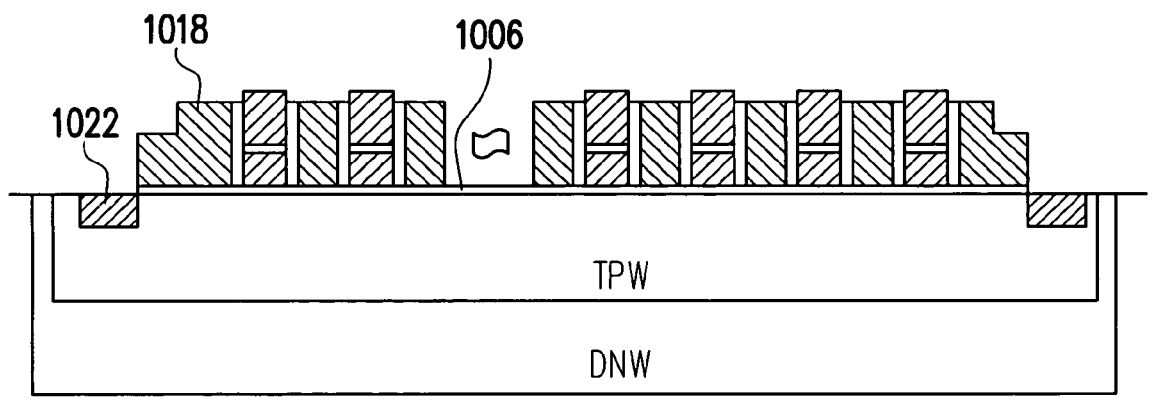

In FIG. 21F, an implantation process with another photoresistor mask (not shown) is performed to implant dopants into the substrate to form the doped regions 1022. One of the doped regions 1022 serves as the bit line terminal to apply the bit line voltage, and the other one of the doped regions 1022 serves as the source terminal.

Figure 21G:
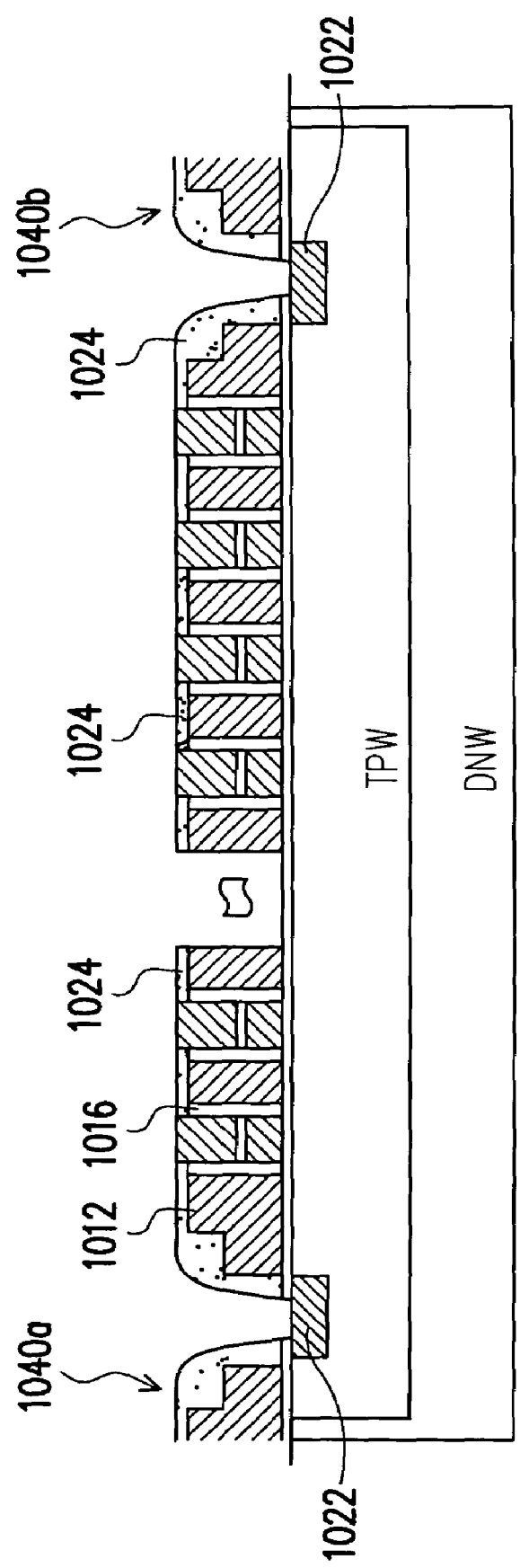

In FIG. 21G, a dielectric layer is formed over the substrate and an planarization process, such as etching back process or CMP process is performed to expose the stack gate structure.

Figure 21H:
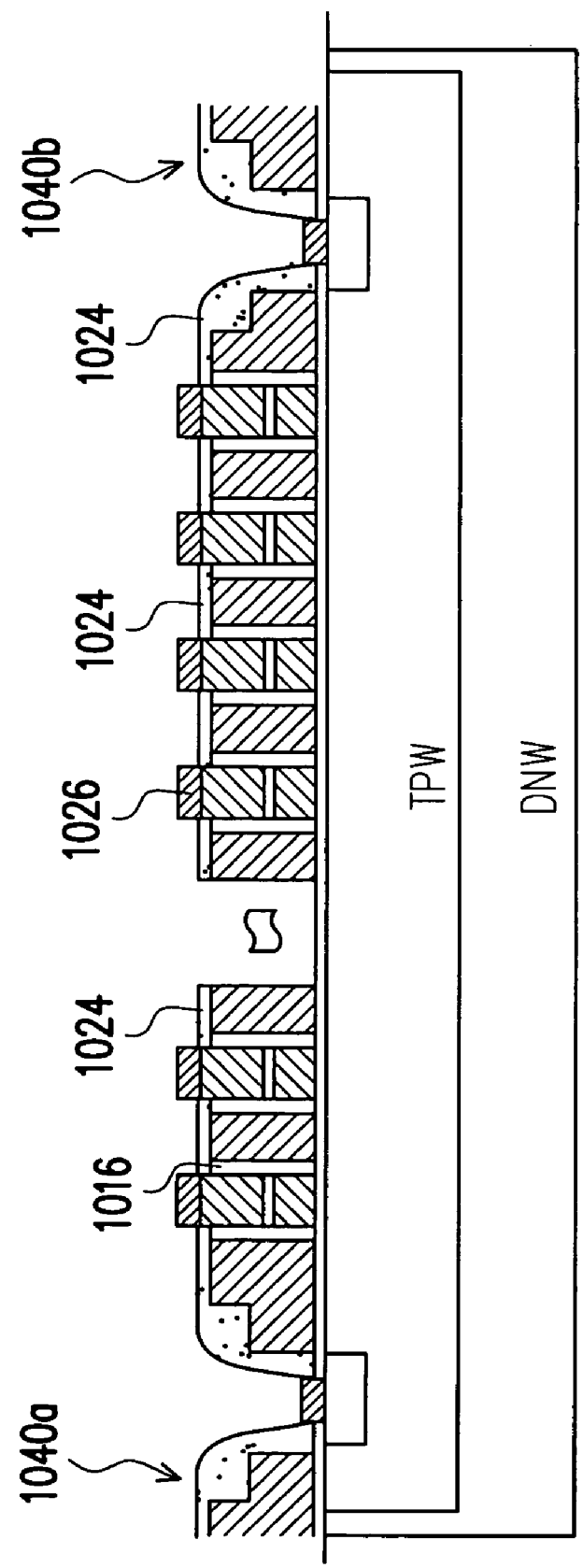

In FIG. 21H, the remaining portion of the dielectric layer is indicated by 1024, which covers the selection gate. In order to have the better ohm contact for the subsequent interconnect structure, a silicide layer 1026 is formed on the exposed Si-contained surface, such as the top polysilicon layer of the stack gate and the doped region. The silicide process typically includes, for example, depositing a metal layer, such as titanium, over the substrate, and a thermal reaction process is performed to have the metal layer reacting with silicon to form the silicide. After then, the metal layer without reaction is removed. Here, the structures 1040a, 1040b are one example, representing a repeated structure without further descriptions. The foregoing process is the example for forming the desired structure with respect to FIG. 19A.

The present invention particularly saves the conventional S/D region. Instead, additional gates are formed at the corresponding locations. The gate structures of the invention can have the memory function and also serves as the pass gate when being not selected. The function of pass gate is to extent the S/D region the side of the selected gate, so that the applied voltage on the source and the drain can be led to the selected gate. In other words, one transistor with memory function is created, wherein the source region and the drain region pass through multiple gates. Alternatively, the required drain voltage with respect to the bit line and the source voltage with respect to the source line can be applied to the whole extended S/D regions.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A cell string structure of double-cell memory device with respect to a bit line of a memory device, the cell string structure comprising:
   a first doped region and a second doped region in a substrate; and
   a plurality of gate structures in a string, formed on the substrate between the first doped region and the second doped region, wherein each of at least a portion of the gate structures serves as a memory cell, wherein each of the gate structures is separately coupled to a word line,
   wherein no additional doped region is in the substrate between the first doped region and the second doped region.

2. The cell string structure of claim 1, further comprising a first selection MOS transistor and a second selection MOS transistor, wherein the first selection MOS transistor has a first source/drain region coupled to the bit line and a second source/drain region serving as the first doped region, and the second selection MOS transistor has a first source/drain region coupled to a system voltage source Vss and a second source/drain region serving as the second doped region.

3. The cell string structure of claim 2, wherein the first selection MOS transistor and the second selection MOS transistor are used to select a memory block.

4. The cell string structure of claim 1, wherein each of the gate structures has an Oxide/Nitride/Oxide (O/N/O) dielectric layer in separation or without separation.

5. The cell string structure of claim 1, wherein every two of the gate structures are grouped into a double-cell memory cell.

6. The cell string structure of claim 1, wherein each of the gate structures include a gate and an Oxide/Nitride/Oxide dielectric structure layer on the substrate, so as to serving a memory function.

7. The cell string structure of claim 6, wherein the Oxide/Nitride/Oxide dielectric structure layer for each of the gate structures are separated or continuous.

8. The cell siring structure of claim 1, wherein each of the gate structures include a control gate and a floating gate and a gate dielectric layer on the substrate, so as to serving a memory function.

9. The cell string structure of claim 1, wherein the gate structures include a first type structure with memory function including a gate and an Oxide/Nitride/Oxide dielectric structure layer, and a second type structure with memory function including a control gate, a floating gate, and a gate dielectric layer, wherein the first type structure and the second type structure are alternatively disposed between the first dope region and the second doped region.

10. The cell string structure of claim 1, wherein only the even number of the gate structures in the cell string structure are serving for memory function.

11. The cell string structure of claim 1, wherein only the odd number of the gate structures in the cell string structure are serving for memory function.

12. The cell string structure of claim 1, wherein when the first doped region and the second doped region are respectively applied a first voltage and a second voltage, and a selected gate of the gate structures is applied with a third voltage, then the other gate structures are applied with a pass voltage, so that the first doped region and the second doped region in the substrate extend to each side of the selected gate.

13. A layout of a double-cell memory device, comprising:
a plurality of gate structure lines, adjacently disposed over a substrate along a direction, wherein at least a portion of the gate structure lines have memory function; and
a plurality of first doped regions, in the substrate at a side of a first line of the gate structure lines;
a plurality of second doped regions, in the substrate at a side of a last line of the gate structure lines, wherein the first doped regions and the second doped regions respectively for a plurality of pairs of doped region with respect to a plurality of bit lines, wherein no addition doped region is in the substrate between the corresponding pair of doned region.

14. The layout of claim 13, further comprising:
a first selection gate line along the direction, wherein a plurality of source/drain (S/D)) regions in pairs in a substrate at each side of the first selection gate line, so as to form a plurality of first selection transistors with respect to the bit lines, wherein one of the S/D regions in pairs is the first doped regions; and
a second selection gate line along the direction, wherein a plurality of S/D) regions in pairs in the substrate at each side of the second selection gate line, so as to form a plurality of second selection transistors with respect to the source lines, wherein one of the S/D) regions in pairs is the second doped regions.

15. The layout of claim 14, wherein the first selection gate line and the second selection gate line are applied a turn-on voltage to activate the selection transistors.

16. The layout of claim 13, wherein when one of the gate structure lines with memory function is selected, the other gate structure lines are applied with a pass voltage, so as to cause the first doped region and the second doped region in the substrate to extend to each side of the selected gate line.

17. The layout of claim 13, wherein each of the gate structure lines include a gate line and an Oxide/Nitride/Oxide dielectric structure line layer on the substrate, so as to serving for memory function.

18. The layout of claim 17, wherein the Oxide/Nitride/Oxide dielectric structure line layers for each of the gate structure lines are separated or continuous.

19. The layout of claim 13, wherein each of the gate structure lines include a control gate line and a floating gate line and a gate dielectric layer on the substrate, so as to serving for memory function.

20. The layout of claim 13, wherein the gate structure lines include a first type structure with memory function including a gate line and an Oxide/Nitride/Oxide dielectric structure line layer, and a second type structure with memory function including a control gate line, a floating gate line, and a gate dielectric layer, wherein the first type structure and the second type structure are alternatively disposed between the first dope region and the second doped region.

21. The layout of claim 13, wherein only the even number of the gate structure lines are serving for memory function.

22. The layout of claim 13, wherein only the odd number of the gate structure lines are serving for memory function.

23. A stack-gate memory cell string structure, with respect to a bit line of a memory device, the string structure comprising:
a first doped region and a second doped region in a substrate, wherein the first doped region and the second doped region are respectively coupled to the bit line and a source voltages, wherein no additional doned region in the substrate between the first doved region and the second doped region;
a plurality of selection gates over the substrate between the first doped region and the second doped region, wherein a first one of the selection gates is adjacent to the first dope region; and
a plurality of stack-gate structures, over the substrate between the selection gates, wherein the stack-gate structures respectively coupled to word lines.

24. The string structure of claim 23, wherein a last one of the selection gates is adjacent to the second doped region.

25. The layout of claim 13, wherein the gate structure lines are respectively coupled to a plurality of words lines.

* * * * *